(12) United States Patent
Huerta et al.

(10) Patent No.: US 8,546,863 B2
(45) Date of Patent: Oct. 1, 2013

(54) NONVOLATILE MEMORY CELL COMPRISING A NANOWIRE AND MANUFACTURING METHOD THEREOF

(75) Inventors: Almudena Huerta, Leuven (BE);
Michiel Jos Van Duuren, Valkenswaard (NL); Nader Akil, Sterrebeek (BE);
Dusan Golubovic, Leuven (BE);
Mohamed Boutchich, Heverlee (BE)

(73) Assignee: NXP B.V., Eindhoven (NL)

( * ) Notice: Subject to any disclaimer, the term of this patent is extended or adjusted under 35 U.S.C. 154(b) by 254 days.

(21) Appl. No.: 12/594,673

(22) PCT Filed: Apr. 17, 2008

(86) PCT No.: PCT/IB2008/051478
§ 371 (c)(1),
(2), (4) Date: Oct. 5, 2009

(87) PCT Pub. No.: WO2008/129478
PCT Pub. Date: Oct. 30, 2008

(65) Prior Publication Data
US 2010/0117138 A1 May 13, 2010

(30) Foreign Application Priority Data
Apr. 19, 2007 (EP) ................................. 07106502

(51) Int. Cl.
*H01L 29/76* (2006.01)
*H01L 21/336* (2006.01)
(52) U.S. Cl.
USPC .............. 257/314; 257/302; 257/E29.274; 438/258; 977/943

(58) Field of Classification Search
USPC ........ 977/743, 943; 257/315, 324, E21.409, 257/E29.309, 302, 304, 311, 314, 326, 329, 257/263, E29.274; 438/257, 258
See application file for complete search history.

(56) References Cited

U.S. PATENT DOCUMENTS

| | | | |
|---|---|---|---|
| 6,433,382 B1 * | 8/2002 | Orlowski et al. | 257/315 |
| 2003/0015755 A1 | 1/2003 | Hagemeyer | |
| 2006/0118975 A1 | 6/2006 | Koenenkamp | |
| 2007/0228433 A1 * | 10/2007 | Forbes | 257/296 |
| 2007/0228491 A1 * | 10/2007 | Forbes | 257/401 |
| 2008/0061351 A1 * | 3/2008 | Jang et al. | 257/315 |
| 2008/0173922 A1 * | 7/2008 | Hong et al. | 257/315 |

FOREIGN PATENT DOCUMENTS

| | | |
|---|---|---|
| EP | 1 420 414 A | 5/2004 |
| WO | 2004/040667 A | 5/2004 |
| WO | 2005008770 A1 | 1/2005 |
| WO | 2005/124872 A | 12/2005 |

OTHER PUBLICATIONS

Pein et al, Performance of the 3-D Pencil Flash EPROM Cell and Memory Array IEEE Transactions on Electron Devices, IEEE Service Center, Pisacataway, NJ; US, vol. 42, No. 11, Nov. 1, 1995, pp. 1982-1991, XP000582412 ISSN: 0018-9383.*

(Continued)

*Primary Examiner* — Selim Ahmed

(57) ABSTRACT

A memory cell, the memory cell comprising a substrate, a nanowire extending along a vertical trench formed in the substrate, a control gate surrounding the nanowire, and a charge storage structure formed between the control gate and the nanowire.

18 Claims, 29 Drawing Sheets

(56) References Cited

OTHER PUBLICATIONS

"A Non-Volatile Multi-Level Memory Cell Using Molecular-Gated Nanowire Transistors" Electronics, Circuits and Systems, 2006. ICECS '06, 13th IEEE International Conference on Dec. 10-13, 2006; pp. 1034-1037.*

Pein, H., et al; "Performance of the 3-D Pencil Flash EPROM Cell and Memory Array": IEEE Transactions on Electron Devices; IEEE Service Center, Pasacataway, NJ, US; vol. 42, No. 11; Nov. 1, 1995; pp. 1982-1991; XP000582412; ISSN 00018-9383.

* cited by examiner

NONVOLATILE MEMORY CELL COMPRISING A NANOWIRE AND MANUFACTURING METHOD THEREOF

FIELD OF THE INVENTION

The invention relates to a memory cell.

Moreover, the invention relates to a memory array.

Beyond this, the invention relates to a method of manufacturing a memory cell or a memory array comprising a plurality of memory cells.

BACKGROUND OF THE INVENTION

The storage of huge amount of information on computer systems becomes more and more important. Particularly, flash memory arrays may be employed for this purpose.

Two-transistor configurations in a memory cell with an access transistor and a memory transistor allow fast random access and low power program and erase by tunnelling.

FIG. 1 shows a conventional two-transistor configuration with a conventional floating gate memory cell 100.

In a silicon substrate 101, a source region 102, a source and drain region 103 and a drain region 104 are provided as highly doped portions. An access transistor 110 comprises a gate oxide layer 111, an access gate 112, an interpolydielectric (IPD) layer 113, a contact structure 114 and a polysilicon structure 115. Furthermore, a memory transistor 120 is provided which comprises a tunnel oxide layer 111, a floating gate 121, an interpolydielectric layer 113 and a control gate 122.

Thus, FIG. 1 shows a transistor configuration in which the memory transistor 120 is implemented with a floating gate 121. Typically, the gate oxide 111 is approximately 8 nm thick. The memory transistor 120 stores the information (charge) in the floating gate 121. Both tunnel oxide 111 and interpolydielectric 113 layer are thicker than 8 mm due to retention issues.

According to another conventional two-transistor memory architecture which is shown as a memory cell 200 in FIG. 2, an access transistor 210 is provided as well as a memory transistor 220. As a charge carrier storage structure, the memory transistor 220 includes an ONO layer 221, that is a silicon oxide-silicon nitride-silicon oxide layer sequence.

FIG. 2 shows a so-called SONOS memory cell 200 (semiconductor-silicon oxide-silicon nitride-silicon oxide-semiconductor).

The access transistor 110, 210 (basically a MOSFET) which acts like a switch contributes to the selection/inhibition of a memory transistor 120, 220 in a memory array comprising a large number of memory cells 100, 200. The use of an access transistor 110, 210 allows the memory 100, 200 to be fully programmed and erased by Fowler-Nordheim tunnelling and allows to operate the individual memory cells 100, 200 without disturbing cross talk. The memory transistor 120, 220 stores the information that is encoded in stored electric charge. This charge can be injected in a polysilicon floating gate layer 121, a nitride layer of the ONO layer 221, nanocrystal dots, etc.

FIG. 2 therefore illustrates a transistor configuration in which the memory transistor 220 is implemented as a SONOS sequence. In this case, both the access transistor 210 and the memory transistor 220 have a single poly layer 112, 122. The gate oxide 111 of the access transistor 210 has a thickness of approximately 8 nm. The memory transistor 220 stores the information (charge) in a nitride layer 230 of approximately 6 nm thickness and is sandwiched between two insulator ($SiO_2$) layers, namely a bottom oxide 231 and a top oxide 232 of 2 nm and 8 nm thickness, respectively, whereas the three layers 230 to 232 form the ONO layer 221.

However, it is a problem that a standard planar flash memory cannot be scaled properly beyond 50 nm. Particularly, the scaling of tunnel and control dielectric thickness is limited by concerns for data-retention, yielding low coupling ratios and consequently high operating voltages. Moreover, one of the major limiting scaling parameters for two-transistor flash cells is the length of the access gate transistor 110, 210, which under worst case conditions (Fowler-Nordheim program inhibit) should have a leakage current not exceeding approximately 100 pA with as much as 5 V on its drain. These circumstances result in the fact that future scaled cells suffer of short channel effects and punch through phenomena, as well as of small on-current/off-current ratio, thus reducing the sensing margin.

A possible strategy is to increase the control of the gate over the channel with configurations such as double gate and FinFET transistors to increase the coupling efficiency between the control gate over the floating gate. Higher coupling is needed to scale down the programming voltages so as the memory cell dimensions. However, double gate and FinFET transistors are difficult in manufacture and operation.

US 2003/0015755 A1 discloses a vertical transistor, a memory arrangement and a method for fabricating a vertical transistor. Particularly, US 2003/0015755 A1 discloses a vertical transistor which has a source region, a drain region, a gate region, and a channel region between the source region and the drain region, which are arranged in a vertical direction in a semiconductor substrate, the gate region having an electrical insulation from the source region, from the drain region and from the channel region and being arranged around the channel region in such a way that the gate region and the channel region form a coaxial structure.

However, with the procedure of forming a memory arrangement according to US 2003/0015755 A1, it may be difficult to obtain a sufficient integration density of memory cells. Furthermore, the manufacturing procedure according to US 2003/0015755 A1 is difficult and cost intensive.

OBJECT AND SUMMARY OF THE INVENTION

It is an object of the invention to provide a memory having a sufficient integration density.

In order to achieve the object defined above, a memory cell, a memory array, and a method of manufacturing a memory cell according to the independent claims are provided.

According to an exemplary embodiment of the invention, a memory cell is provided, the memory cell comprising a substrate, a nanowire (particularly an oblong nanowire) extending along a vertical trench formed in the substrate, a control gate surrounding the nanowire, and a charge storage structure formed between the control gate and the nanowire.

According to another exemplary embodiment of the invention, a memory array is provided, the memory array comprising a plurality of memory cells having the above-mentioned features and formed in the (common) substrate.

According to still another exemplary embodiment of the invention, a method of manufacturing a memory cell is provided, the method comprising forming a vertical trench in a substrate, forming a nanowire (particularly an oblong nanowire) extending along the vertical trench, forming a control gate surrounding the nanowire, and forming a charge storage structure between the control gate and the nanowire.

The term "memory cell" may particularly denote a physical structure (such as a layer sequence) which allows to store information in an electronic manner. An amount of information stored in a memory cell may be 1 bit (which may be encoded, for instance, in the presence or absence of charge carriers in a dedicated structure) or may be more than 1 bit (which may be encoded, for instance, in the amount of stored charge and/or the type of the charge carriers, that is to say positively or negatively charged charge carriers).

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "nanowire" may denote a wire-like structure of dimensions in the order of magnitude of several to several hundreds of nanometers (and may also cover larger or smaller dimensions). Many different types of nanowires may be used for embodiments of the invention, including semiconducting nanowires (for instance made of silicon, germanium, InP, GaN, etc.), metallic nanowires (for instance nickel, platinum, gold), and nanotubes, particularly carbon nanotubes (intrinsic or doped). According to an exemplary embodiment of the invention, such nanowires may form the channel of a transistor.

The term "oblong nanowire" may denote that the length of the nanowire is larger, particularly significantly larger, than a dimension perpendicular to the length extension. In other words, typical nanowires may exhibit aspect ratios (the ratio between length to width) of more than one, particularly of more than 2, more particularly of more than 5, or up to 1000 or more. For instance, a tubular nanowire may have a length of 50 nm to 70 nm and may have a diameter of 10 nm.

The term "charge storage structure" may particularly denote a structure that is specifically adapted to allow introducing electric charge in this structure by tunnelling or other programming procedures. The charge storage structure may be adapted in a manner that this charge is stored and remains stored within the structure for a sufficiently long time. Examples for appropriate charge storage structures are a floating gate, a nitride layer of an ONO layer sequence, etc.

The term "source/drain region" may particularly denote a source region or a drain region. Since the functionality of a source region and a drain region may depend on the operation mode of a transistor, for instance voltages applied thereto, the term source/drain region may denote a structure which can act as a source region or as a drain region.

The term "vertical trench" may denote an oblong blind hole formed in a surface and extending inside of the substrate. In other words, a substrate usually has a main surface, and the trench is usually formed perpendicularly to this main surface. However, the term "vertical" may cover also embodiments in which a certain deviation from the 90° angle between trench and main surface of the substrate is present, but in which the trench still has a relatively steep orientation inside of the material of the substrate.

According to an exemplary embodiment of the invention, a method of producing memory cells is provided in which vertical nanowires are grown or are formed using an etching procedure as channels of transistors of the memory cells, wherein a gate stack may be partially or all-wrapped around the respective channel, for instance to form a coaxial structure. Furthermore, the nanowires may be grown within trenches surrounded by electrically insulating structures such as silicon oxide that provides electrical isolation between word lines in a memory array configuration. By taking this measure, it may be made possible to improve scaling issues.

In other words, an area required for a memory array may be scaled down to a great extent with enhanced control over the channel. Beyond this, efficient process integration is possible to build memory arrays with vertical nanowire-based transistors.

A measure for advanced solid-state nanoelectronic devices is the surrounding gate geometry. Transistors having a surrounding gate structure have proper sub-threshold behaviour due to the high coupling efficiency and a significant reduction of short channel effects compared to double gate or FinFET devices. Silicon nanowire-based transistors exhibit advantageous properties. Moreover, vertically aligned nanowires are capable to reduce the processing complexity and result in ultra high transistor densities as the transistor geometry is pushed into the third dimension. 3D geometry also shows more relaxed conditions regarding transistor lengths that greatly helps as the access transistor should sustain 5V on its drain at low leakage current. By forming a nanowire within a trench, the growing or etching procedure may be very simple and may allow to mechanically protecting the relatively sensitive nanowire.

Such memory cells may be implemented in a SONOS (semiconductor-silicon oxide-silicon nitride-silicon oxide-semiconductor) or floating gate architecture with a single transistor or a two-transistor configuration in stand-alone flash memories. In other words, an array of 3D memory cells with one or two nanowire-based transistors may be provided for ultrahigh integration densities. Particularly, a vertical memory cell may be built around a nanowire with a gate stack of one or more transistors all wrapped around the nanowire.

More particularly, an easy process integration scheme is provided to build arrays of three-dimensional memory cells comprising nanowire-based transistor configurations with one or two transistors. Such a cell design may enable the reduction of the whole memory array to a great extent. Moreover, as the gate stack may be all-wrapped around the nanowire, a high coupling coefficient may be obtained. By providing an all-wrapped around gate for a vertical nanowire, positioning the channel as a vertical nanowire may allow to obtain ultrahigh densities. As the gate may be all-wrapped around, there is full control of the gate over the channel that prevents short channel effects and increases the drive current density (improved access time). For an embodiment of a floating gate flash, the coupling characteristic between the control gate and the floating gate may be greatly improved, since the control gate may be all-wrapped around the floating gate. In an embodiment in which a nanowire is grown (for instance on a catalyst or precursor), there is no surface etching needed which results in a simple manufacturing architecture. In case of growing nanowire, the surface may be smooth so that it is possible to gain mobility (less traps).

By using a two-transistor configuration with an access transistor and a memory transistor, it may be possible to allow for a fast random access and a low power operation, since the program procedure and the erase procedure can be fully realized by tunnelling. The access transistor (basically a MOSFET transistor), which may act like a switch, may help in the selection/inhibition of the memory transistor within the array. The use of the access transistor may allow the memory to be fully programmed and erased by Fowler-Nordheim tunnelling.

It may be possible to select the dimensions of the nanowire width to be approximately ten (10) nm or several ten nanometers, which may be particularly advantageous in combination with the use of nitride spacers at the drain which reliably prevents any electrical contact between the drain and the gate, thus the nanowire can be much smaller than the contact.

Therefore, an increased integration density may be obtained. It is also possible to manufacture the gate to be self-aligned to the trenches at the beginning of the process integration to isolate the word lines. When trenches are used, one mask may be saved which results in reduced costs. Thus, in order to define the source lines and the gates, this may be performed within one mask. The trench formation may require one additional mask, but then the source lines and the gate lines may be self-aligned to the trenches. Furthermore, the use of silicon nanowires may be cheap in manufacture.

According to an exemplary embodiment, a flash cell may be provided which is a non-volatile memory being able to store its information for a long period of time without refreshment.

Thus, it is possible to provide a memory array with an area that is scaled down to a great extent with enhanced control over the channel (reduced drain-induced barrier lowering, short channel effects, etc.) and drive current density (improved access time). A nanowire based memory cell according to an exemplary embodiment of the invention does not suffer from corner effects, in contrast to FinFET approaches.

The coupling efficiency between the control gate over the floating gate may be greatly improved as the control gate is all wrapped around the floating gate. The process integration is relatively easy and makes it feasible to build memory arrays with a large number of cells comprising vertical nanowire-based transistors. The process integration covers several memory cell implementations with a memory transistor implemented as a floating gate or as a SONOS, with or without an access transistor, etc.

The 3D geometry of a cell has the advantage that the channel current may flow vertically so that there is no need to scale down the length of the transistors. As the length of the transistor can be relatively long due to the vertical integration, it is possible to store multiple bits in the charge storage layer or structure, for instance with a SONOS memory transistor programmed by hot carrier injection (similar to an NROM).

Therefore, vertical nanowires may be grown as a channel of transistor of the memory cell, where the gate stack may be all-wrapped around a channel. The nanowire may be grown within trenches surrounded by silicon dioxide which may provide isolation between the bit lines in an array configuration.

Next, further exemplary embodiments of the memory cell will be explained. However, these embodiments also apply to the memory array and to the method.

The memory cell may comprise a first source/drain region (particularly a drain) coupled to a substrate external end portion of the nanowire and may comprise a second source/drain region (particularly a source) coupled to a substrate internal end portion of the nanowire. In other words, the end portion of the nanowire which is deepest buried within the trench connected to the substrate may form the second source/drain region, whereas the end portion of the nanowire which is closer to the main surface of the layer sequence (close to the bit lines) may form the first source/drain region. The first and second source/drain regions may be doped, for instance $n^+$-doped or $p^+$-doped. In contrast to this, the nanowire may be intrinsically or weakly doped, for instance may be n-doped or p-doped. Thus, the nanowire may form the channel portion of a nanowire-based field effect transistor.

A contact structure may be coupled to the first source/drain region. Such a contact structure may be an electrically conductive portion which provides an electric coupling between the nanowire and an environment external to the memory cell which may be formed as a monolithically integrated circuit. Thus, such a contact structure may be a filled via and may be made of materials such as highly doped polysilicon, silicide, or may be made from a metallic material such as copper or nickel.

The memory cell may comprise an electrically insulating spacer structure surrounding the first source/drain region for securely electrically decoupling the first source/drain region from the control gate. Such an electrically insulating spacer structure may be formed on a laterally limited layer sequence, whereas the lateral walls of such a layer sequence may be covered with an electrically insulating material such as silicon dioxide ($SiO_2$) or silicon nitride ($Si_3N_4$). It may be highly advantageous to reliably decouple the source/drain region from the control gate to avoid undesired current paths or leakage currents.

The contact structure may be broader than the first source/drain region in a lateral direction. Such a lateral direction may be orthogonal to the vertical direction along which the nanowire extends. When the nanowire is smaller than the contact, an undesired electrically contact between the drain and the gate may be prevented.

The charge storage structure may comprise at least one of the group consisting of a floating gate, an ONO structure, a silicon nitride structure, and a nano-crystal dot structure. A floating gate may be an electrically conductive portion such as a polysilicon structure in which charge carriers may be stored by tunnelling or other programming procedures. An ONO structure is a silicon oxide-silicon nitride-silicon oxide layer sequence, wherein charge carriers may be permanently stored in the nitride layer by Fowler-Nordheim tunnelling or the like. A simple silicon nitride layer may also serve as a basis for a proper charge storage structure, for instance in an embodiment in which miniature dimension of the memory cell is desired. However, also nano-crystals may be used to store charge carriers such as electrons or holes.

The control gate may surround the nanowire along its entire circumference. In other words, the control gate may be provided with a blind hole through which the nanowire extends, thereby forming a coaxial nanowire gate structure. This may allow for an accurate control of the electrical conductivity of the nanowire by applying an electric voltage to the control gate.

A cross-section of the nanowire may have a diameter of less than 100 nm, particularly of less than fifty (50) nm, more particularly of less than twenty (20) nm. According to a preferred embodiment, the nanowire has a diameter of 10 nm that allows to properly control conductivity by the surrounding gate.

Furthermore, an access gate may be provided surrounding the nanowire. The access can be part of an access transistor which may be considered as a switch which can be switched on or off by applying a voltage to the access gate. By such a two-transistor configuration, namely a configuration with an access gate and a control gate, a properly controllable memory system may be provided.

The access gate may be buried deeper within the trench than the control gate. In other words, a current flow may occur from the second source/drain region through the portion of the nanowire adjacent to the access gate, through the portion of the nanowire adjacent to the control gate, and to the first source/drain region, or vice versa.

The nanowire may be a semiconductor nanowire (such as made from silicon, germanium, etc.), a carbon nanotube (electrically conductive or semiconductive), a silicon nanowire or a group III-group V nanowire such as made of gallium arsenide.

Next, further exemplary embodiments of the memory array will be explained. However, these embodiments also apply to the memory cell and to the method.

The memory array may comprise a plurality of memory cells, particularly thousands or millions or billions or more of memory cells. These may be arranged in a matrix-like manner, wherein each of the individual memory cells can be addressed by bit lines and word lines, as known by the skilled person.

For programming, a memory cell may be selected by activating a specific access transistor, and by applying corresponding voltages to the control gate and to the source/drain connections so as to induce tunnelling or other programming effects which inject charge carriers in the charge carrier structure. After such a programming procedure, the charge carriers may remain permanently or for a long time in the charge carrier structure.

For reading out the stored information, a memory cell may again be selected by applying a readout voltage to the access gate. The current flow along the nanowire may then depend on the conductivity of the channel portion adjacent to the memory transistor, and therefore from the fact whether the charge carrier structure has been provided with charge carriers during a previous programming phase or not. Therefore, a current flowing between the source/drain regions depends on the stored information and is indicative of the stored information.

In order to avoid or suppress artefacts (when programming or reading out the memory cell or in a passive mode of the memory cell) due to leakage or tunnelling effects, electrically insulating regions may be formed between adjacent trenches formed in the same substrate. This may allow to reliably decouple different word lines.

A common control gate may be provided for a sub-group of at least two of the plurality of memory cells. For instance, a single assigned control gate may control a column or row of memory cells. This may allow for a secure readout and an efficient architecture.

The memory array may be a two-dimensional arrangement of the memory cells, but may also be a three-dimensional stack of memory cells. Particularly, the latter measure further increases the storage volume and the integration density.

Next, further exemplary embodiments of the method will be explained. However, these embodiments also apply to the memory cell and to the memory array.

The nanowire may be formed by a growing procedure. For this purpose, a precursor may be provided in the trench so as to define a location at which the growth of the nanowire starts. This is a very simple procedure that allows to accurately define a portion at which a nanowire grows.

Alternatively, the nanowire may be formed by an etching procedure using a wafer (n-type or p-type). In such a scenario, the trench may be filled with material forming the nanowire, and a subsequent etching procedure may then define the lateral extension of the nanowire.

The method may be carried out in CMOS technology. Since the described procedures are compatible with CMOS technology, it may be possible to form a memory purely in semiconductor technology.

In an embodiment of the invention in which a floating gate configuration is implemented, programming a memory cell may be performed by applying a voltage of 12 V to 15 V to the control gate, and by simultaneously grounding the two source/drain regions (i.e. source and drain). Then, charge carriers may be injected into the floating gate by Fowler-Nordheim tunnelling. Since embodiments of the invention significantly improve the coupling efficiency, the programming voltage may be reduced compared to conventional approaches. Reading out a memory cell may be performed by applying a voltage of 1 V to the control gate, by applying a voltage of 0.5 V to the drain and by grounding the source. A voltage of 1 V may be applied to the access gate. Erasing a memory cell may be performed by applying a voltage of −12 V to −15 V to the control gate, and by simultaneously grounding the two source/drain regions (i.e. source and drain), so that charge carriers may be injected into or removed from the floating gate by Fowler-Nordheim tunnelling. The given voltage values are only examples and may vary over a broad interval. They may depend on dimensions, materials and electronic characteristics of the memory cell such as the threshold voltage of the transistor(s).

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, and BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 7 to FIG. 17, FIG. 31 to FIG. 46 show layer sequences (cross-sectional views and partial plan views) obtained during carrying out a method of forming the memory cell of FIG. 5 according to an exemplary embodiment of the invention.

DESCRIPTION OF EMBODIMENTS

Figure 1:
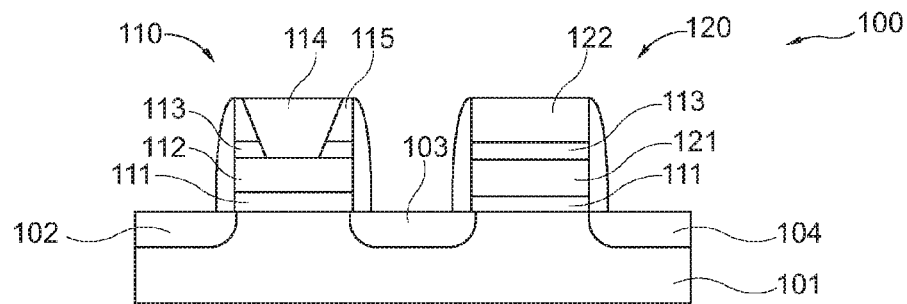
FIG. 1 shows a conventional two-transistor memory cell comprising an access transistor and a floating gate memory transistor.
Figure 2:
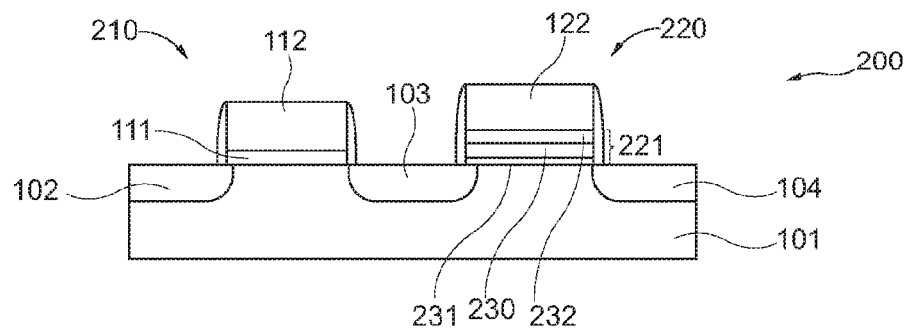
FIG. 2 shows a conventional two-transistor memory cell comprising an access transistor and an ONO memory transistor.

The illustration in the drawing is schematical. In different drawings, similar or identical elements are provided with the same reference signs.

In the following, referring to FIG. 3, a memory cell 300 according to an exemplary embodiment of the invention will be explained.

The memory cell 300 comprises a substrate 301 that is an n-type silicon wafer. An oblong nanowire 302 extends along a vertical trench formed in the substrate 301. Furthermore, a control gate 303 is provided which surrounds the nanowire 302 in a coaxial manner along a portion of the vertical extension of the nanowire 302. A charge storage structure 304 is formed as an ONO layer sequence and is arranged between the control gate 303 and the nanowire 302. Actually, the charge will be stored in the nitride layer of the ONO layer sequence 304.

The memory cell 300 further comprises a first source/drain region 305 (which may particularly act as a drain) and is formed by an n$^+$-doped silicon material. The first source/drain region 305 is coupled to a substrate external end portion 330 of the nanowire 302. The first source/drain region 305 may be a doped portion of the nanowire 302 or may be configured as a separate component. A buried second source/drain region 306 (which may particularly act as a source) is provided in the substrate 301 and is another n$^+$-doped portion. The second source/drain region 306 is coupled to a substrate internal end portion 331 of the nanowire 302. The second source/drain region 306 may be a portion of the substrate 301 or may be configured as a separate component. A contact structure 307 of an electrically conductive material is provided and is electrically coupled to the first source/drain region 305. Beyond this, an electrically insulating spacer structure 308 surrounds the first source/drain region 305 and is adapted for electrically decoupling the first source/drain region 305 from the control gate 303.

Figure 3:
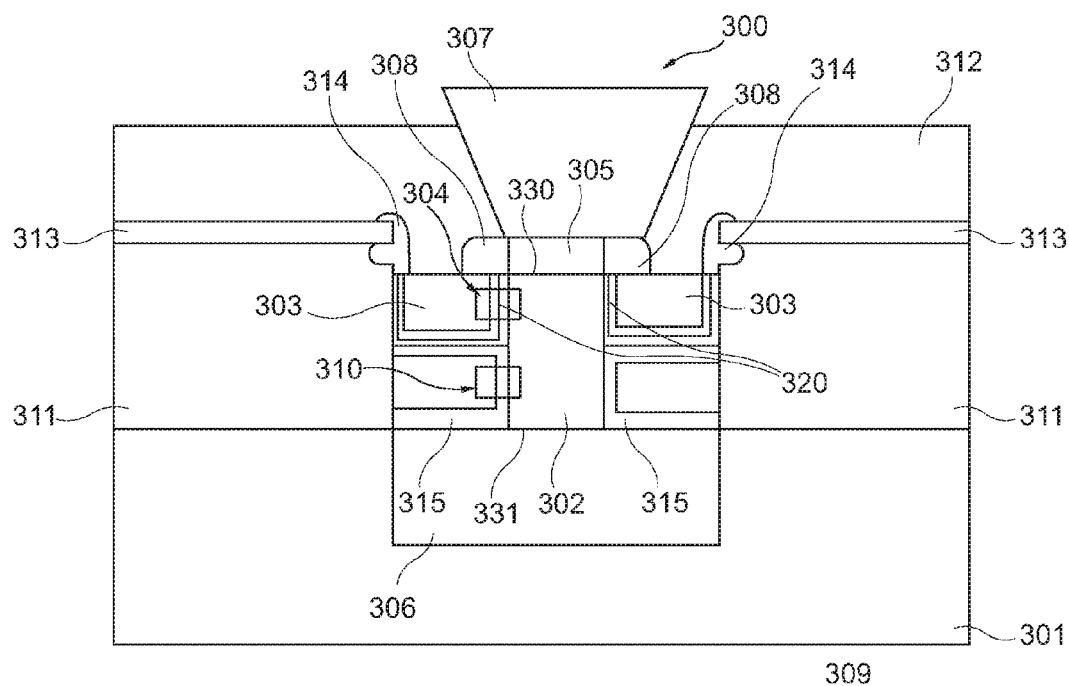
FIG. 3 shows a cross-sectional view of a memory cell comprising an access transistor and an ONO memory transistor according to an exemplary embodiment of the invention.

As can be taken from FIG. 3, the contact structure 307 is broader (in a horizontal direction of FIG. 3) than the first source/drain region 305. The control gate 303 circumferentially surrounds the nanowire 302 entirely, i.e. along its entire diameter. A diameter of the nanowire along a horizontal direction of FIG. 3 is approximately 10 nm.

Furthermore, an access gate 309 is provided below the control gate and is therefore buried deeper within the trench than the control gate 303. The access gate 309 surrounds the nanowire along its entire circumference and along a part of its vertical extension. Depending on a voltage to be externally applied to the access gate 309, the value of the electrical conductivity of a controllable portion 310 of the nanowire 302 may be adjusted so that the access gate 309 serves as an access transistor with the nanowire 302 acting as a channel region.

The memory cell 300 further comprises a lateral silicon oxide (SiO$_2$) structure 311. On a surface of the structure 300, an electrically insulating layer 312 is provided, which may also be made from silicon oxide (SiO$_2$). A silicon nitride layer 313 separates the electrically insulating layers 311 and 312.

Furthermore, an electrically insulating spacer structure 314 is provided. With regard to its environment, the access gate 309 is electrically insulated by an encapsulation structure 315.

In a similar manner, the control gate 303 is partially encapsulated by the ONO layer sequence 304, that is to say by a sequence comprising a first silicon oxide layer, a silicon nitride layer and a second silicon oxide layer.

FIG. 3 shows a cross-section of the memory cell 300 with a two-transistor configuration, namely the described access transistor and the memory transistor, wherein the memory transistor is implemented in a SONOS design. Possible misalignments of the contact 307 with respect to the source/drain region 305 are indicated schematically in FIG. 3.

The intrinsically doped silicon nanowire 302 with an approximate width/diameter of 10 nm or tens of nanometers forms the channel (n-channel) of the access transistor and of the memory transistor and connects drain region 305 and source region 306 which are n-type doped as well but to a higher extent compared to the nanowire 302. The control gate 303/ONO stack 304 (part of the memory transistor) and the access gate 309/gate oxide stack 310 (part of the access transistor) are all wrapped around the channel 302. Since the gate stack 304 and the access gate/gate oxide 310 are all around the channel 302, the controllability of the conductivity of the channel 302 is greatly enhanced. This may lead to a large density drive current and low-density leakage. In the memory cell design, it is taken into account that the contact 307 to the drain 305 may be much larger than the nanowire 302 and that it can also have some misalignment (non-self-aligned contact), this is why nitride spacers 308 may be formed at the drain side 305.

Figure 4:
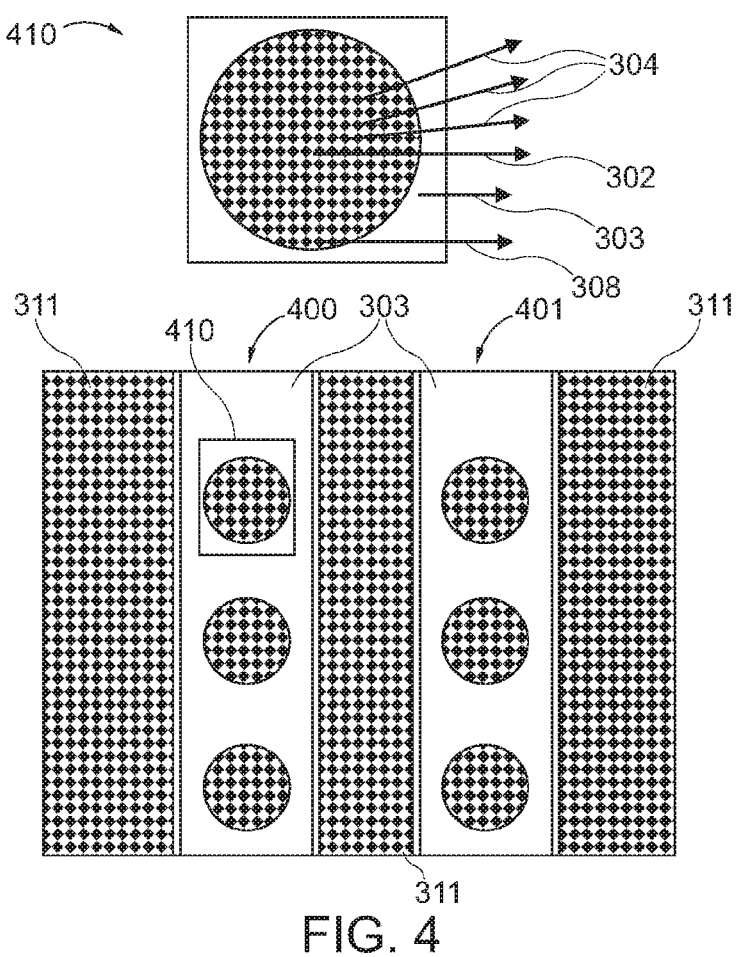
FIG. 4 shows a partial plan view of the memory cell of FIG. 3.

FIG. 4 shows a top view of the cross-section of FIG. 3 where the contact 307 and the silicon oxide passivation layer 312 are not present to make easier the visualization of all the different layers being part of the gate stack around the channel 302.

More particularly, the plan view of FIG. 4 shows a first word line 400 and a second word line 401. However, any desired number of word lines is possible.

An enlarged view 410 is indicated in the overview of FIG. 4 as well. Furthermore, the top oxide, nitride, bottom oxide layer sequence 304, the nanowire 302, the control gate 303 and a nitride spacer 308 are shown as well. Thus, FIG. 4 shows the top view of FIG. 3 without the contact 307 to the drain 305 and the silicon oxide passivation layer 312. The insert 410 shows the different layers within the gate stack all around the channel (nanowire) 302.

In the following, referring to FIG. 5, a memory cell 500 according to another exemplary embodiment of the invention will be explained.

Figure 5:
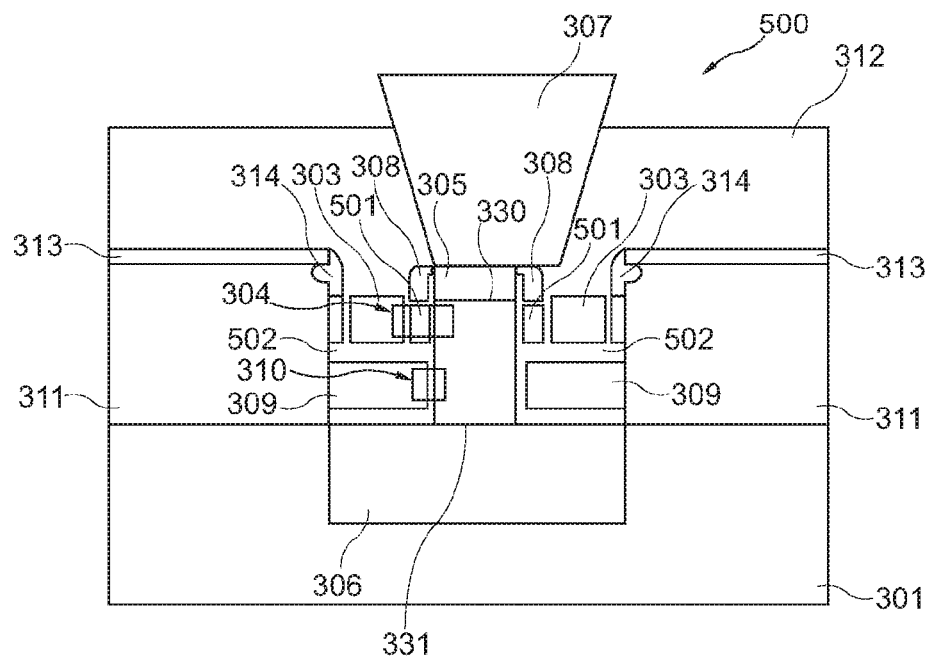
FIG. 5 shows a cross-sectional view of a memory cell comprising an access transistor and a floating gate memory transistor according to an exemplary embodiment of the invention.

The embodiment of FIG. 5 differs from the embodiment of FIG. 3 particularly in that the ONO layer 304 as a charge storage structure is substituted by a floating gate 501, that is to say by an electrically conductive structure which is surrounded by an electrically insulating encapsulation 502. Therefore, charge carriers (such as electrons or holes) stored in the electrically conductive floating gate 501 which may be made of a polysilicon material, may be kept for a long duration in the floating gate 501 to store information. The conductivity of the channel region 302 adjacent to the storage region 304 depends on the type and amount of charge carriers located within the floating gate 501.

Therefore, FIG. 5 shows a two-transistor floating gate memory cell configuration 500. In this embodiment, the memory transistor is implemented using the floating gate 501. The principle is similar as for the SONOS memory cell 300. However, in the embodiment of FIG. 5, the control gate 303-IPD-floating gate 501-tunnel oxide 502 stack of the memory transistor and the access gate 309-gate oxide 502 stack of the access transistor are all wrapped around the nanowire 302 serving as a cylindrical channel region with an essentially circular cross-section.

Figure 6:
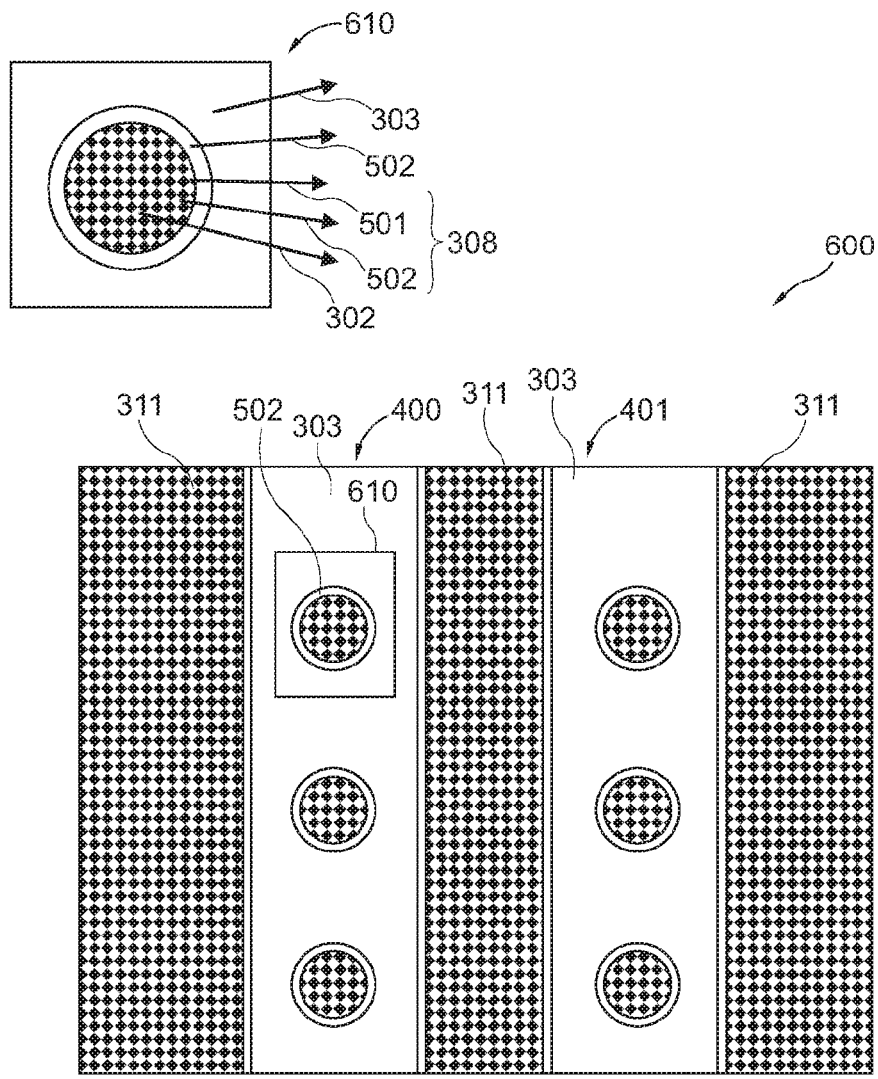
FIG. 6 shows a partial plan view of the memory cell of FIG. 5.

FIG. 6 shows a top view 600 of the memory cell 500 of FIG. 5 without the contact 307 and the silicon passivation layer 312. The insert 610 shows the different layers within the gate stack all around the channel 302 (nanowire). As indicated in the insert 610, the floating gate 501, the tunnel oxide 502 and the nanowire 302 are (partially) covered by the nitride spacer 308.

In the following, referring to FIG. 7 to FIG. 58, embodiments will be explained as to how to build memory cells according to the invention in detail with the whole process integration scheme and some possible variations (such as growing nanowires versus silicon etching of nanowires, one transistor versus two transistor configurations, and floating gate versus SONOS configurations). Silicon oxide has been considered as the dielectric material in these embodiments, although other materials different from silicon oxide (for instance high-k materials or silicon nitride) can also be used for dielectric components. In each of FIG. 7 to FIG. 58, a top view is shown on the left-hand side and a cross-sectional view is shown on the right-hand side.

Figure 7:
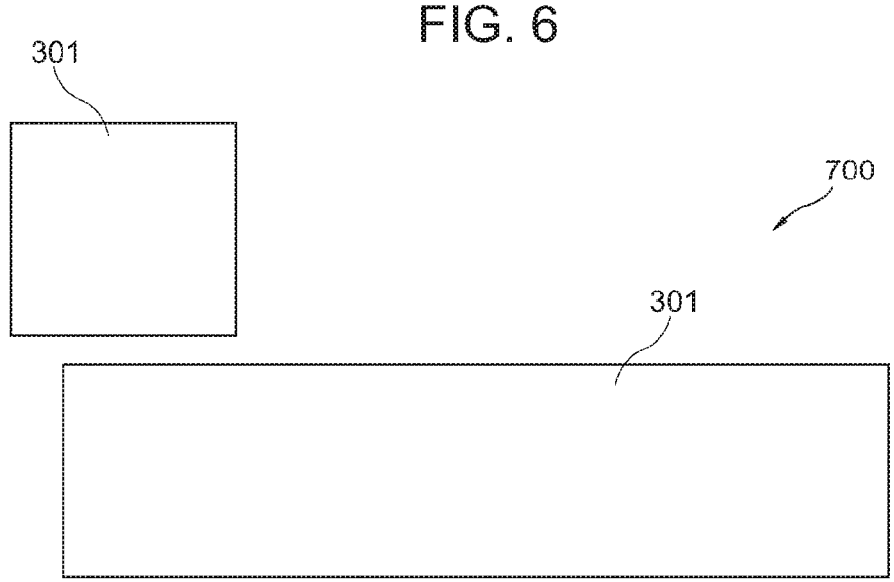
FIG. 7 to FIG. 30 show layer sequences (cross-sectional views and partial plan views) obtained during carrying out a method of forming the memory cell of FIG. 3 according to an exemplary embodiment of the invention.

FIG. 7 shows a layer sequence 700 that consists of an n-type silicon wafer 301. Such an n-type wafer 301 may be used to make a contact to the lower source of a nanowire transistor configuration to be manufactured. A p-well type as a substrate (planar) is not needed in this embodiment, but may be used in other embodiments of the invention.

Figure 8:
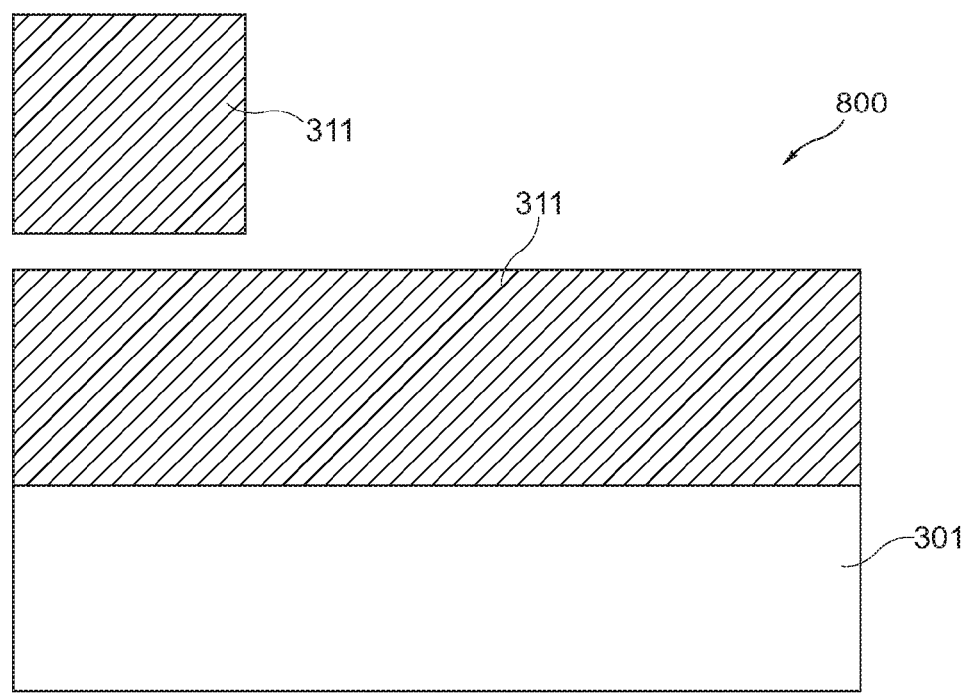

FIG. 8 shows a layer sequence 800 obtained after having deposited a layer of silicon oxide ($SiO_2$) 311 which may later serve to isolate the word lines. Thus, an electrically insulating layer 311 is formed on the substrate 301.

Figure 9:
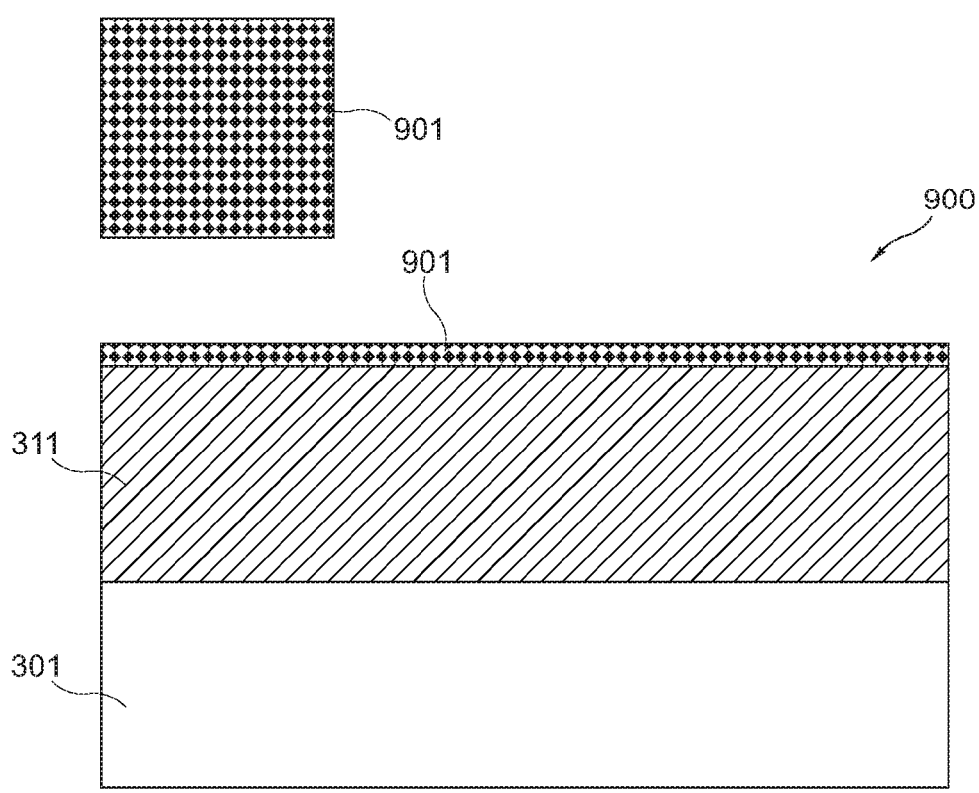

FIG. 9 shows a layer sequence 900 obtained after deposition of a layer of silicon nitride 901 on the silicon oxide layer 311.

Figure 10:
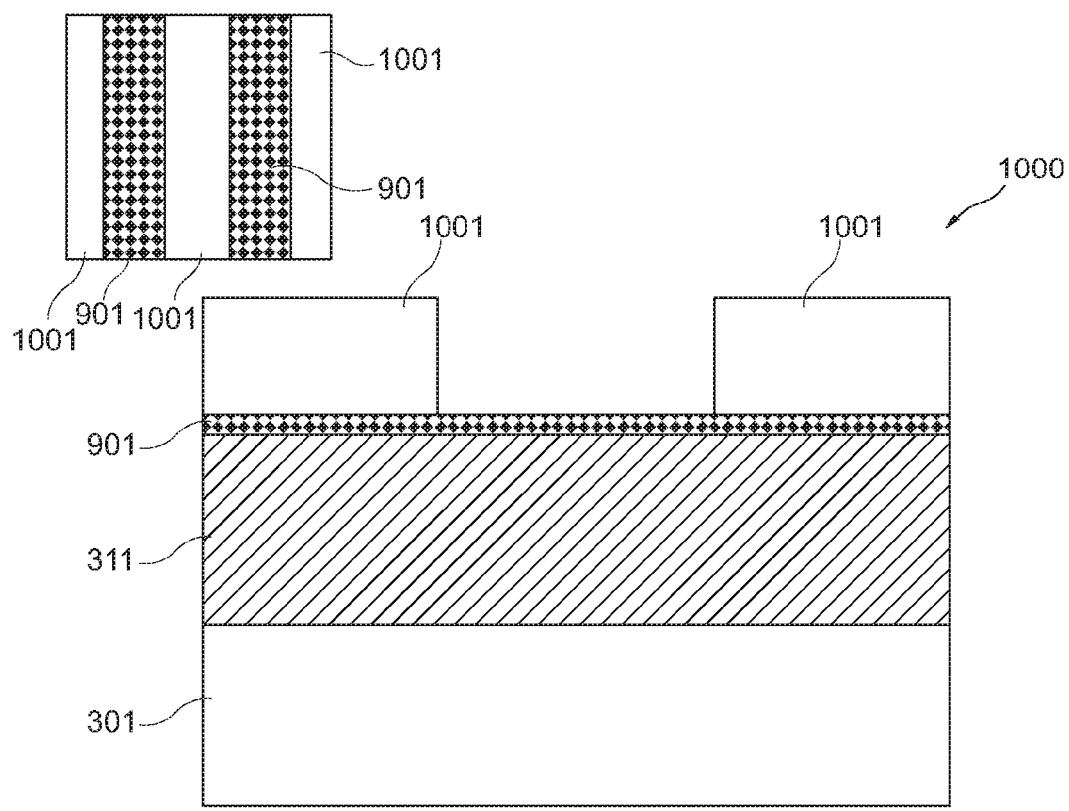

FIG. 10 shows a layer sequence 1000 that is obtained after depositing and etching an auxiliary layer 1001 (such as a photoresist) for patterning the word lines.

Figure 11:
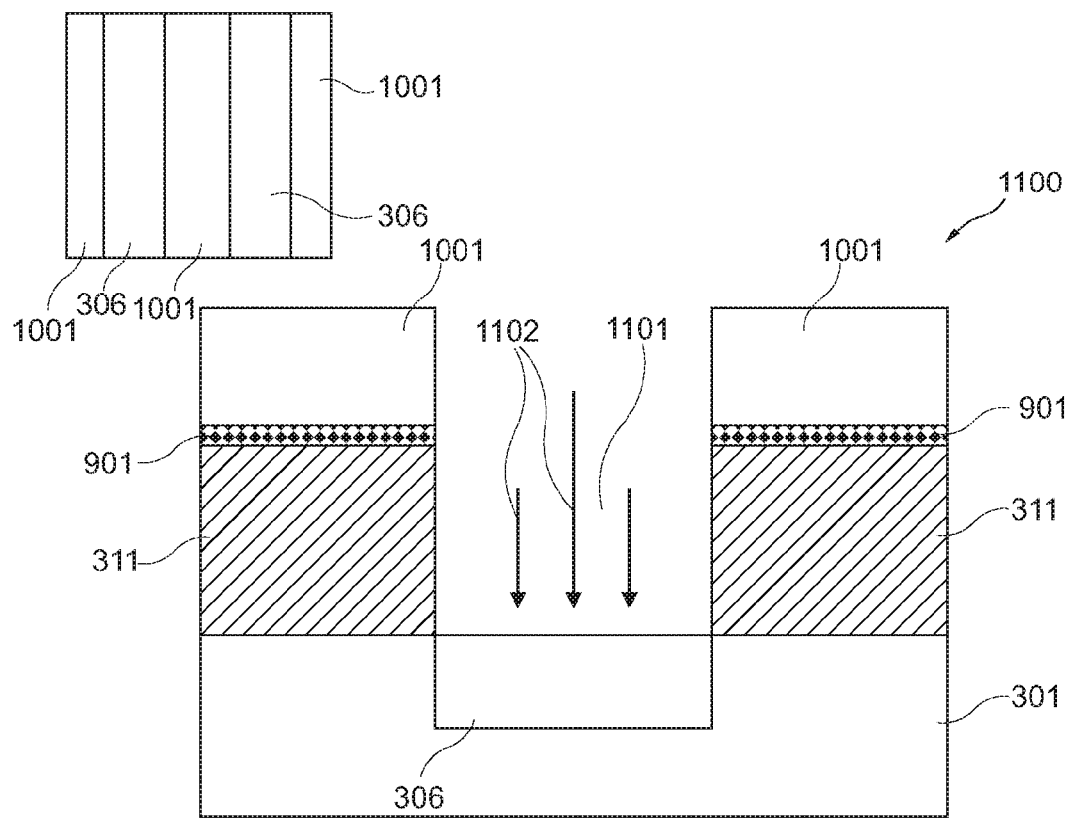

FIG. 11 shows a layer sequence 1100 that is obtained after removing an exposed portion of the layers 901, 311 using the patterned auxiliary layer 1001 as a mask. After having etched a trench 1101 in the layers 901, 311, an exposed portion of the substrate 301 is doped by an $n^+$-implantation to thereby generate an $n^+$-doped source region 306. Arrows 1102 indicate the implantation schematically.

Figure 12:
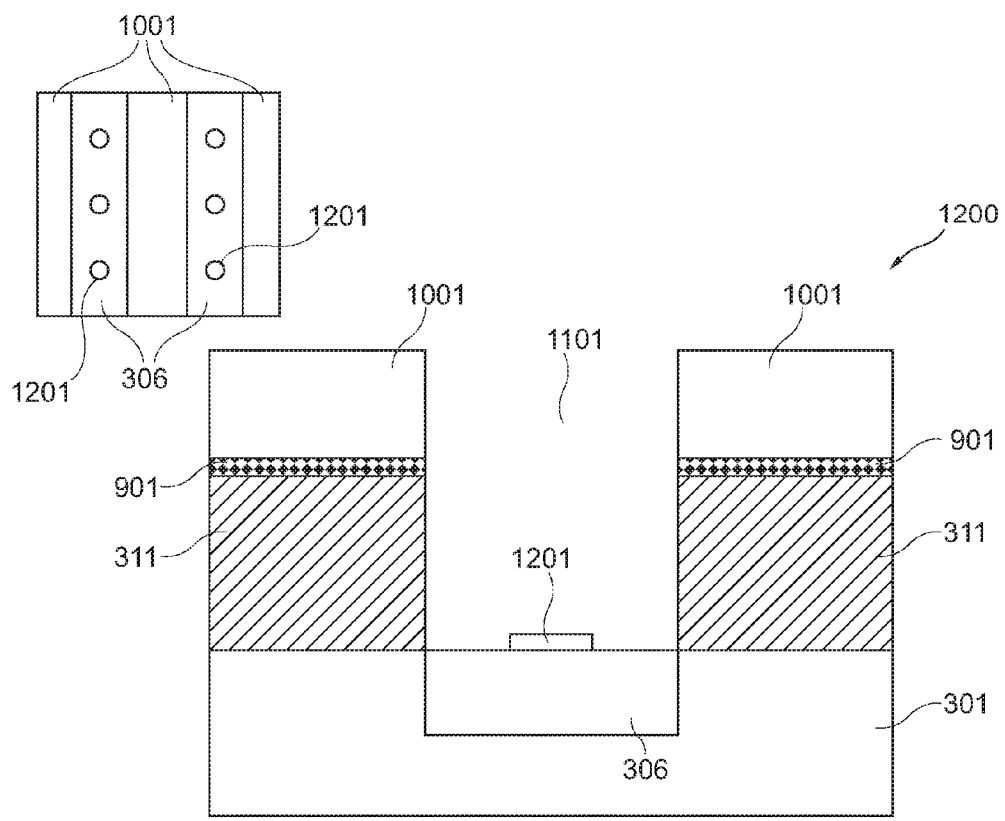

FIG. 12 shows a layer sequence 1200 obtained after deposition of a precursor structure 1201 which will be later used to grow a nanowire. Gold may be used to form the precursor structure 1201. Less contaminate materials such as a titanium catalyst may be used as well. The precursor 1201 is deposited onto a specific position within the trench 1101.

Figure 13:
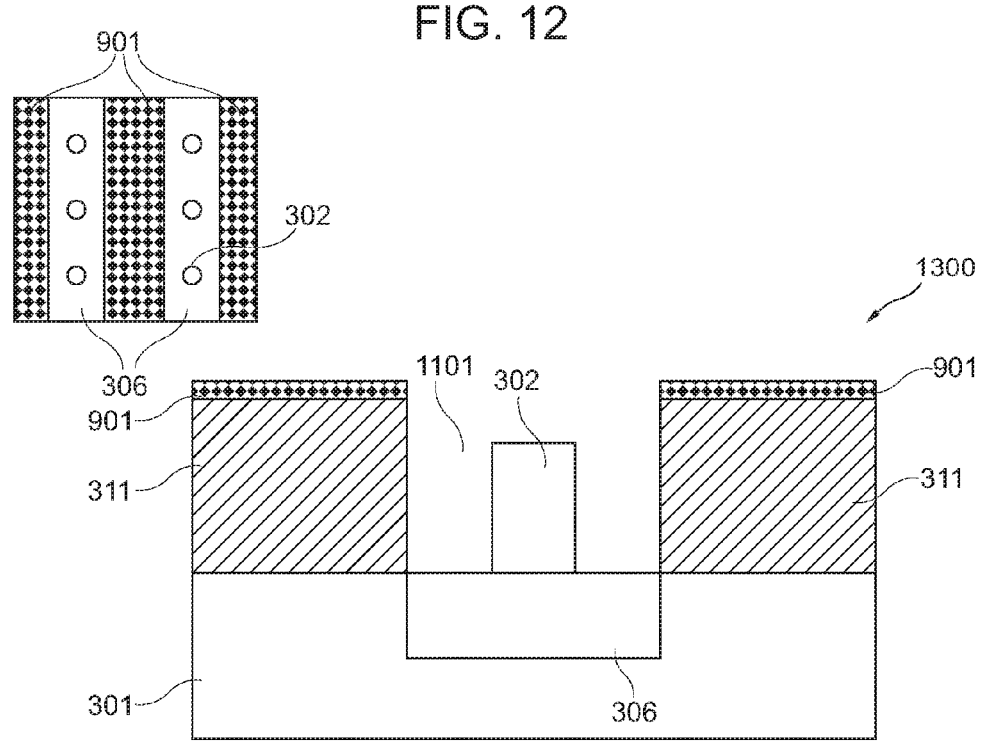

FIG. 13 shows a layer sequence 1300 obtained after growing a nanowire 302 on the precursor 1201 which will later form the channel of the access and memory transistor of the memory cell to be manufactured. Optionally, the precursor 1201 is removed, and the auxiliary layer 1001 may be removed as well.

Figure 14:
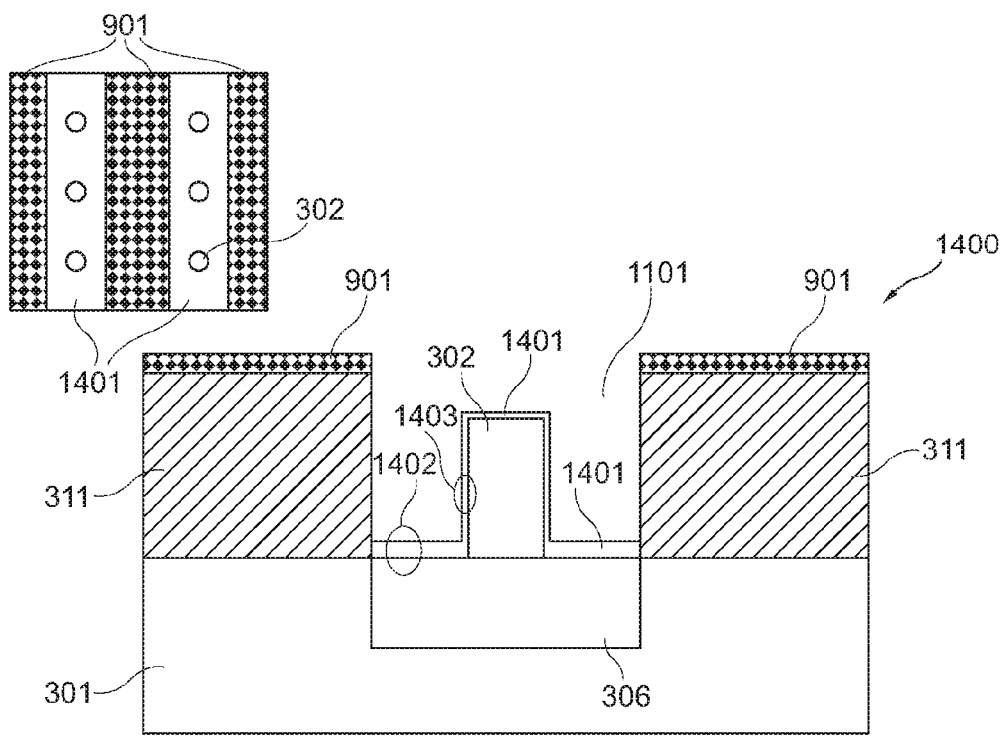

The layer sequence 1400 shown in FIG. 14 is obtained by forming (for instance by thermal oxidation) an electrically insulating layer 1401, for instance of silicon oxide, on the surface of the silicon nanowire 302 and of the source/drain region 306 within the trench 1101. As can be taken from FIG. 14, the grown silicon oxide material 1401 builds a gate oxide 1403 of the access transistor. In a surface region where a higher concentration of a dopant is present, namely on the surface of the source/drain region 306, the oxidation will result in a thicker silicon oxide layer 1402 as compared to a region at the surface of the nanowire 302 which is intrinsically doped. This effect is favourable for providing isolation between the polysilicon (deposited later on) and the source/drain region 306.

Figure 15:
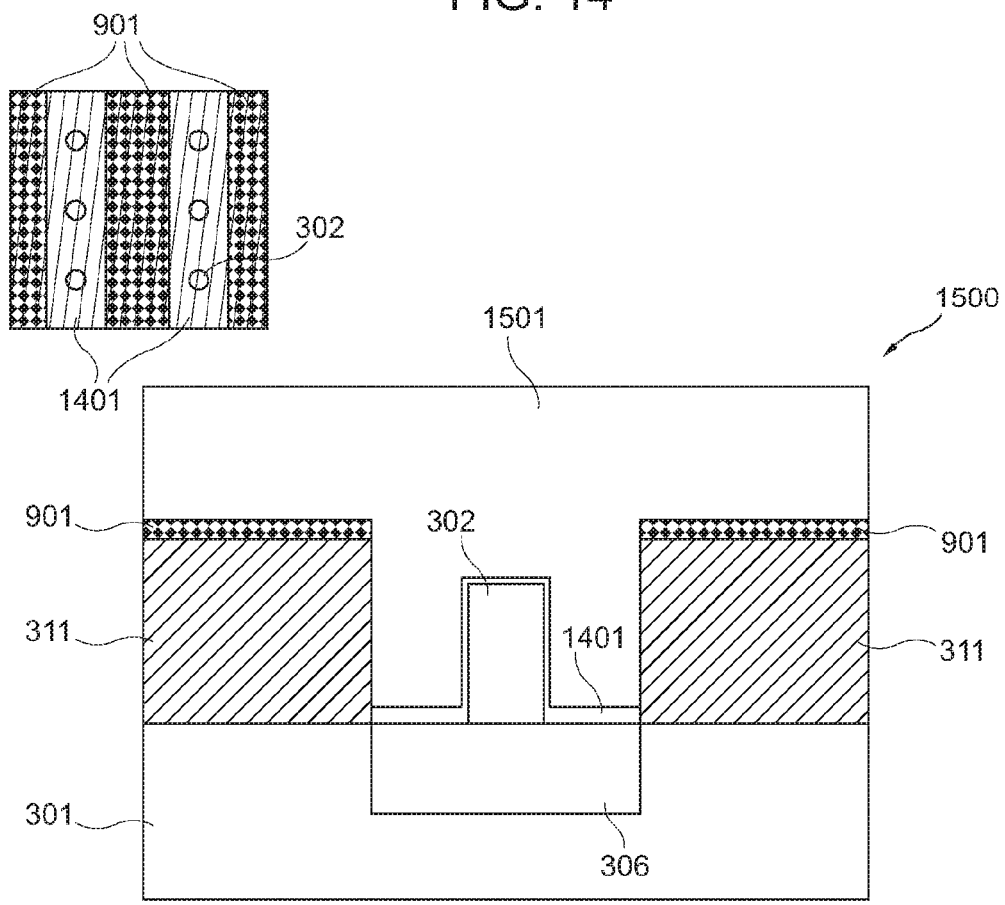

The layer sequence 1500 shown in FIG. 15 is obtained by depositing a polysilicon layer 1501 on the layer sequence 1400. The material of the polysilicon layer 1501 may later form the basis for an access gate.

Figure 16:
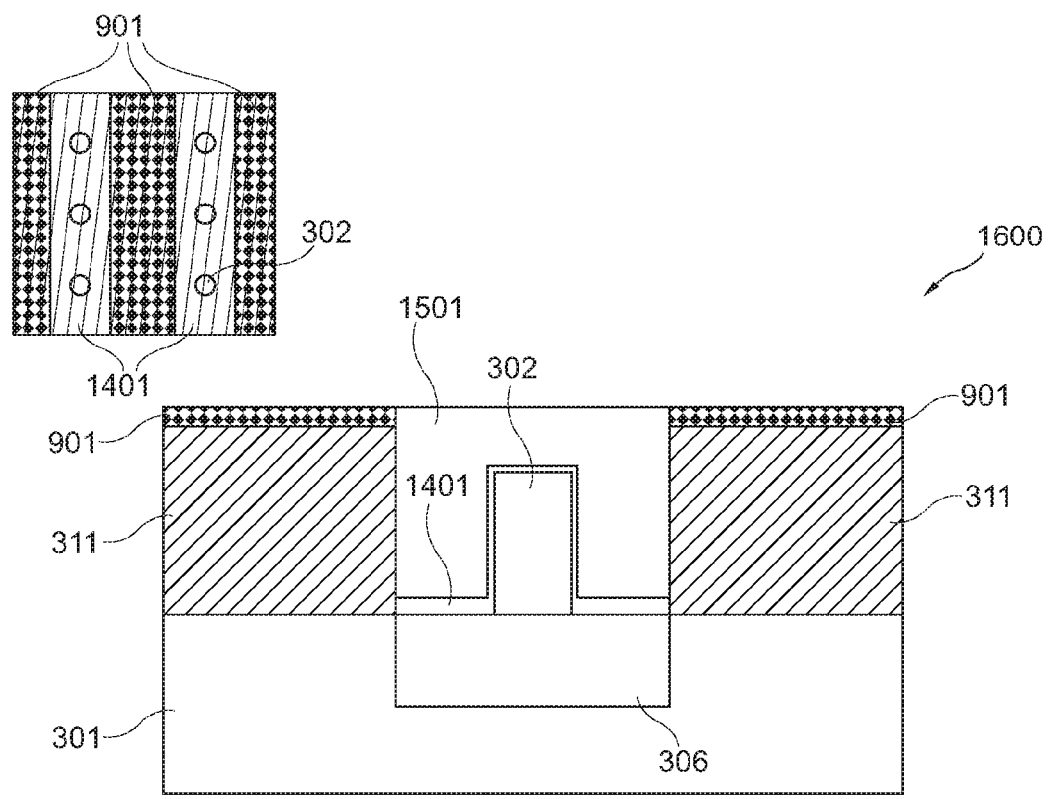

In order to obtain the layer sequence 1600 shown in FIG. 16, the polysilicon structure 1501 is partially removed by CMP ("chemical mechanical polishing").

Figure 17:
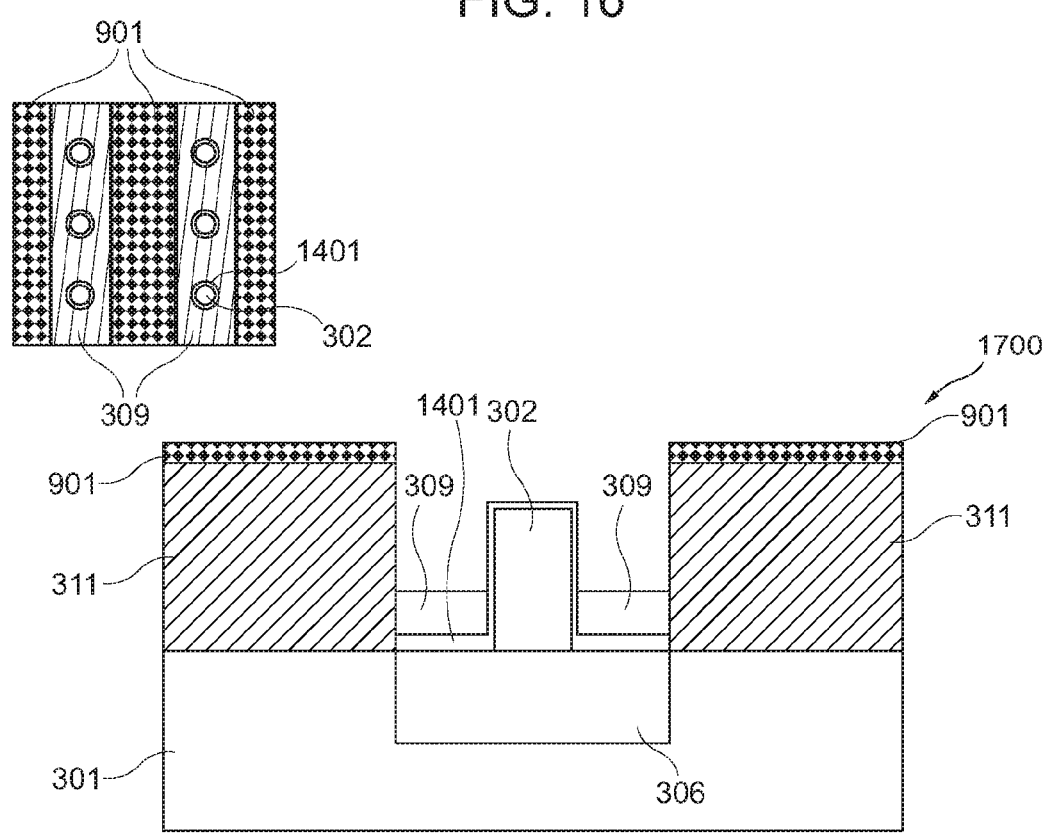

To obtain the layer sequence 1700 shown in FIG. 17, the polysilicon structure 1501 is then etched selectively to oxide and nitride. The remaining polysilicon will later form the basis for the gate region of the access transistor, denoted with reference numeral 309. The polysilicon material is in situ doped.

Figure 18:
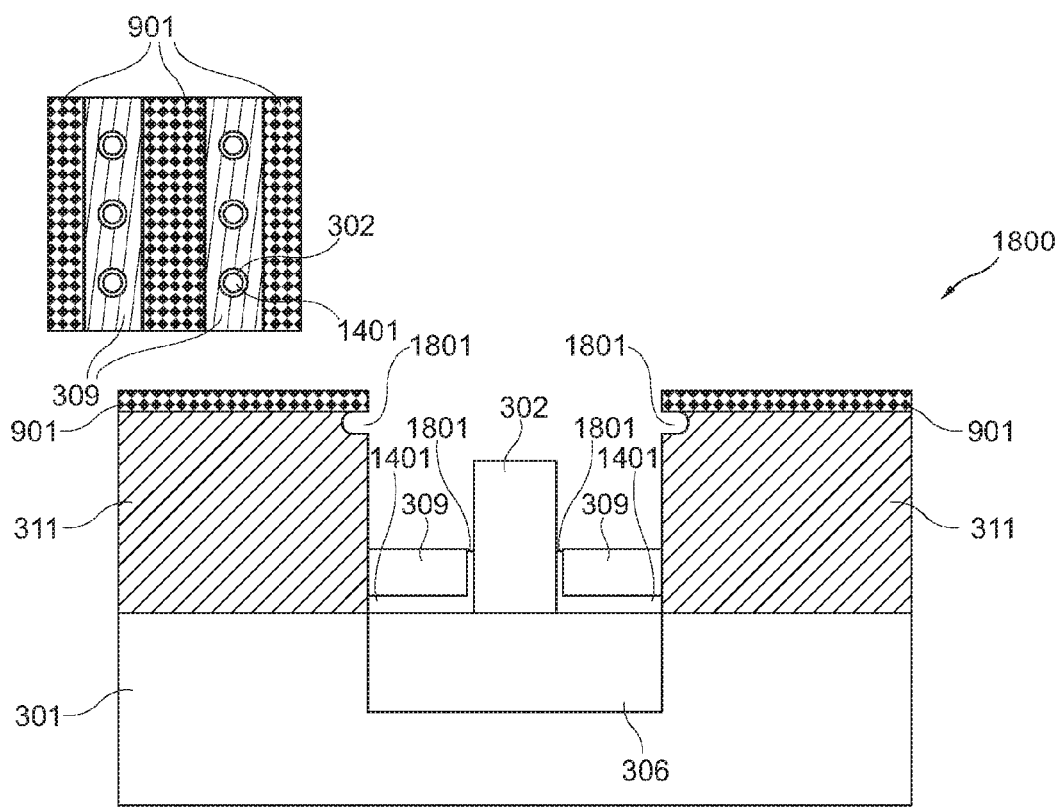

In order to obtain a layer sequence 1800 shown in FIG. 18, the exposed portion of the silicon oxide structure 1401 is etched, so that it is selectively removed from the nanowire 302, and indentations or recesses 1801 may be formed as well as a consequence of the etching procedure.

Figure 19:
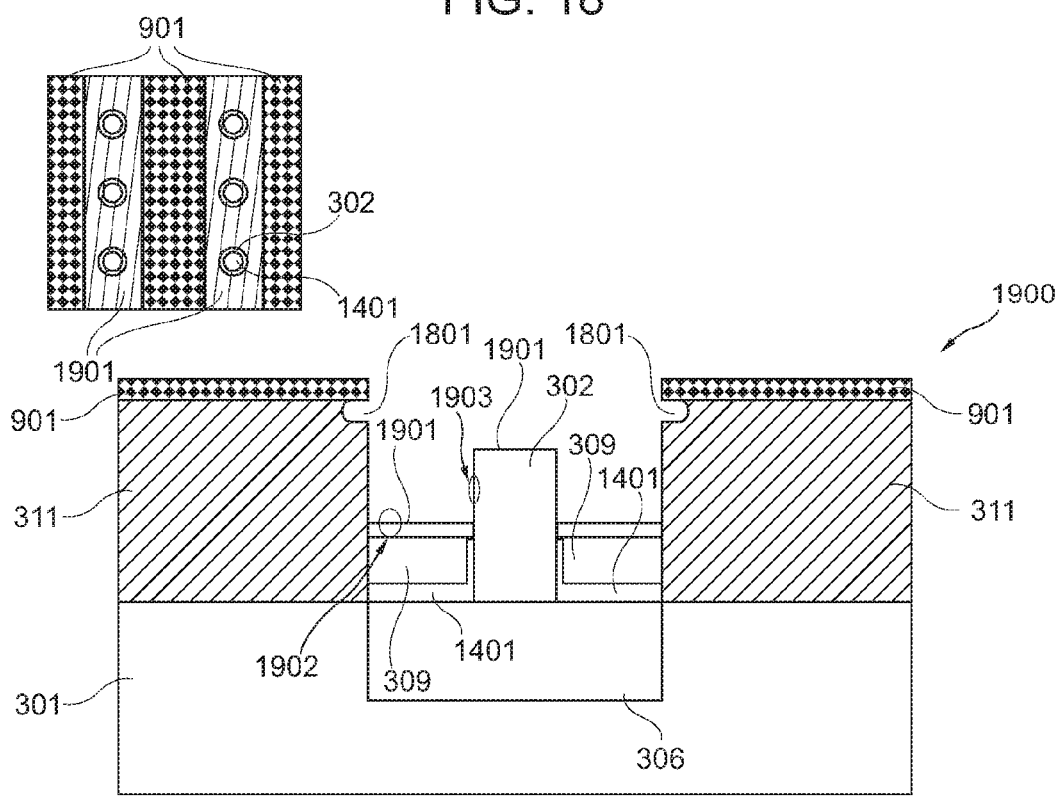

In order to obtain a layer sequence 1900 shown in FIG. 19, a bottom oxide 1901 of an ONO layer (in a configuration of a SONOS memory transistor) is grown, for instance by thermal oxidation. Again, in the polysilicon region 309, the formed oxide layer 1901 is thicker (see portion 1902) than in the nanowire 302 region providing an insulation (see portion 1903). Particularly, the portion 1902 serves as an electrically insulating portion, and the portion 1903 serves as a bottom oxide of the ONO stack (memory transistor in SONOS design).

Figure 20:
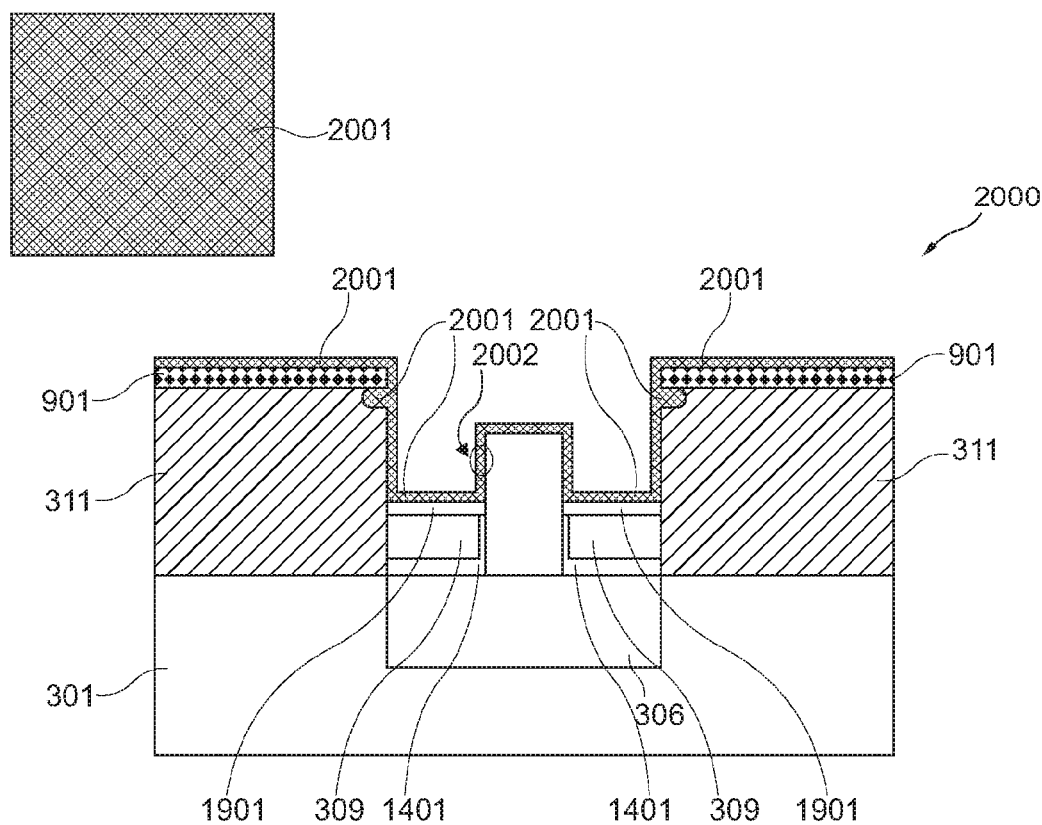

In order to obtain a layer sequence 2000 as shown in FIG. 20, a nitride layer 2001 of the ONO stack to be formed is deposited. The deposition procedure may be performed in a manner that the thickness of the layer 2001 will be essentially uniform. Reference numeral 2002 indicates a portion of the nitride layer 2001 of the ONO stack (control gate in SONOS configuration), i.e. a portion in which charge may be stored for encoding information.

Figure 21:
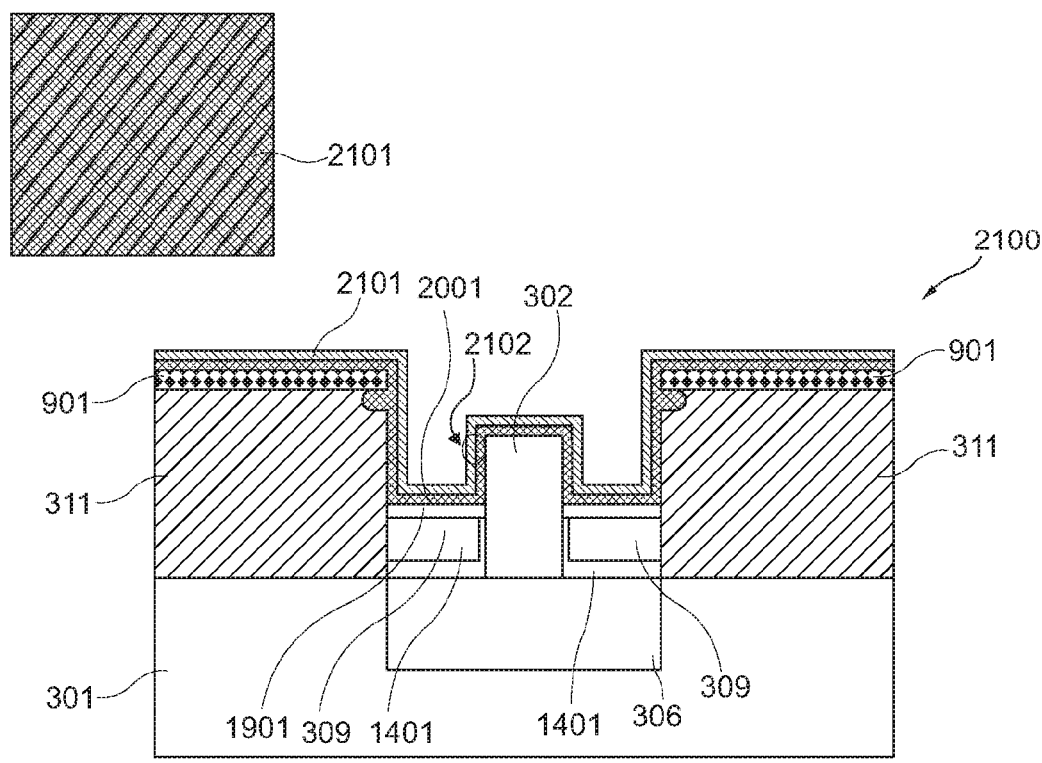

In order to obtain a layer sequence 2100 as shown in FIG. 21, a top silicon oxide layer 2101 is deposited, again essentially uniformly. Therefore, as indicated with reference numeral 2102, an ONO (oxide/nitride/oxide) stack is formed.

Figure 22:
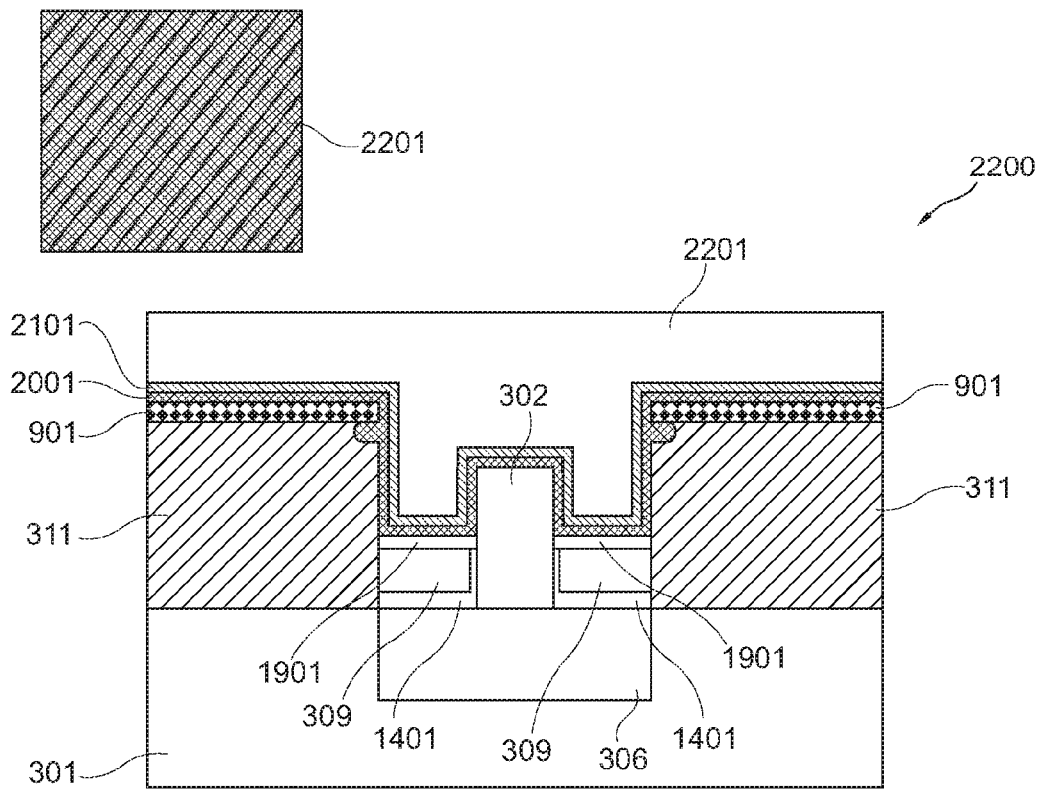

In order to obtain a layer sequence 2200 shown in FIG. 22, a polysilicon layer 2201 is deposited, forming a basis for a control gate polysilicon structure.

Figure 23:
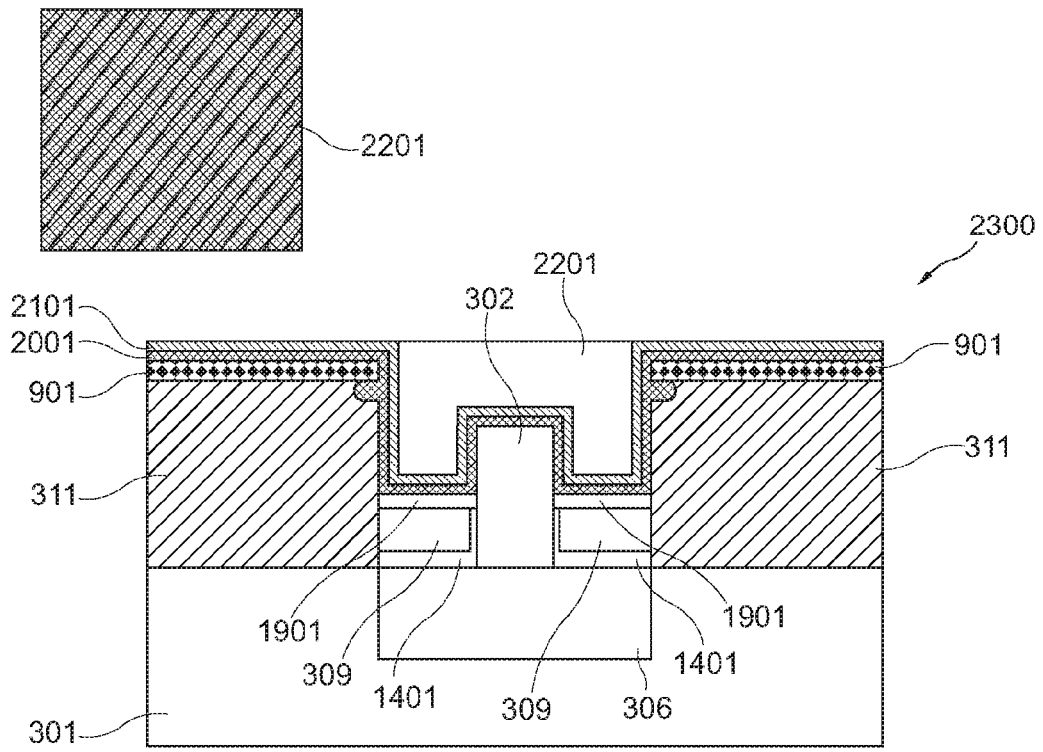

In order to obtain the layer sequence 2300 shown in FIG. 23, the further polysilicon layer 2201 is planarized by CMP ("chemical mechanical polishing").

Figure 24:
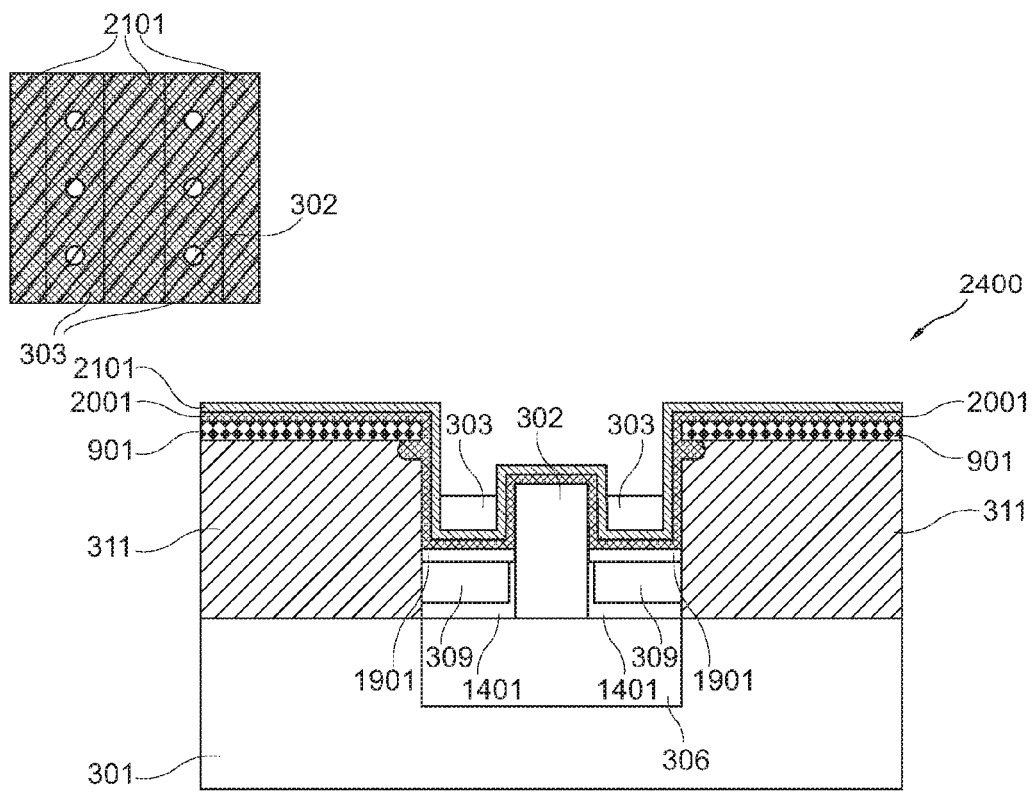

The layer sequence 2400 shown in FIG. 24 is obtained by selectively etching the polysilicon structure 2201 relative to silicon oxide, thereby constituting the polysilicon control gate 303 of the memory transistor. The polysilicon gate 303 is in situ doped.

Figure 25:
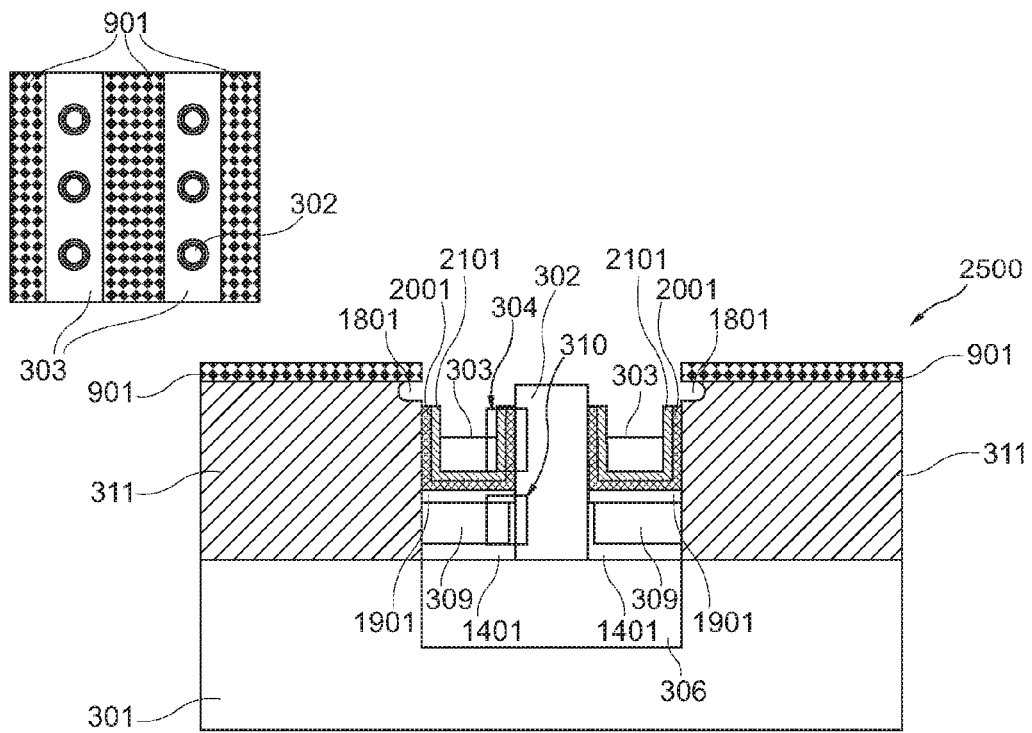

In order to obtain the layer sequence 2500 shown in FIG. 25, the exposed portions of the ONO layer 1901, 2001, 2101 are removed. It is not detrimental if the remained ONO layer 1901, 2001, 2101 is not aligned to the control gate 303 polysilicon material, whenever the ONO layer 1901, 2001, 2101 fully covers the region below the control gate 309. It should be prevented that the ONO layer 1901, 2001, 2101 is overetched below the control gate polysilicon material 303. As can be taken from FIG. 25, the described processing manufactures the memory transistor (SONOS) and the access transistor. The memory portion of the ONO layer 1901, 2001, 2101 which actually stores the charge is shown as a portion illustrated as a rectangular 304.

Figure 26:
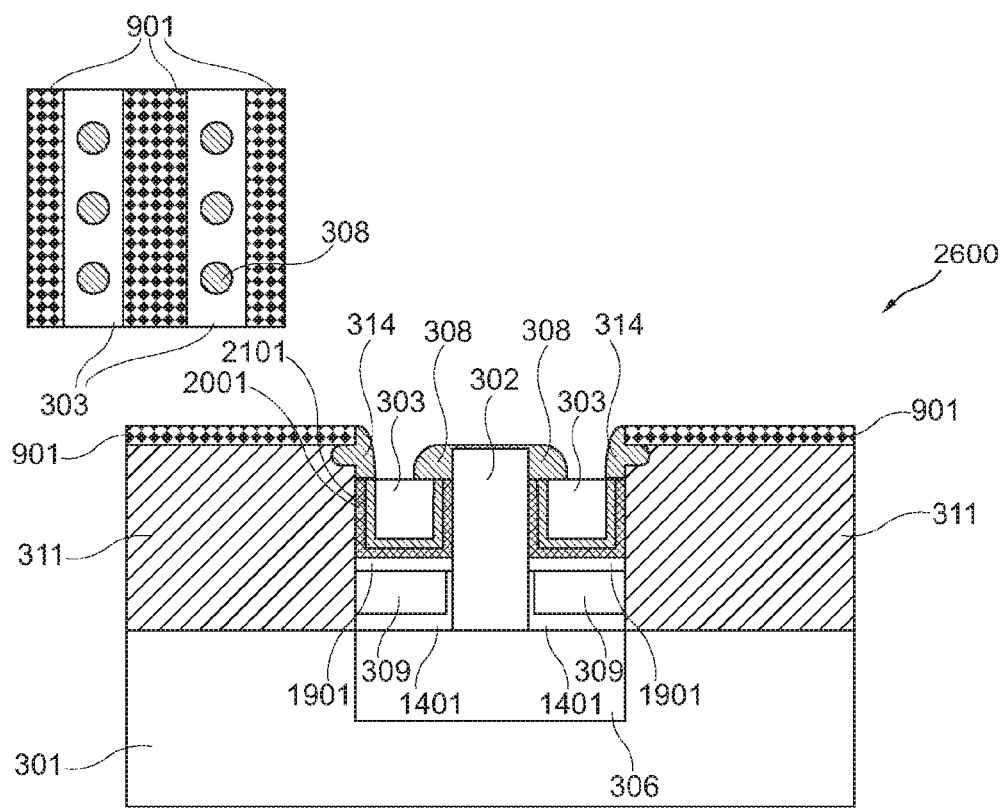

To obtain the layer sequence 2600 of FIG. 26, nitride spacers 308 are formed to make a contact to the drain (to be formed subsequently feasible). Nitride spacers 314 may be formed as well.

Figure 27:
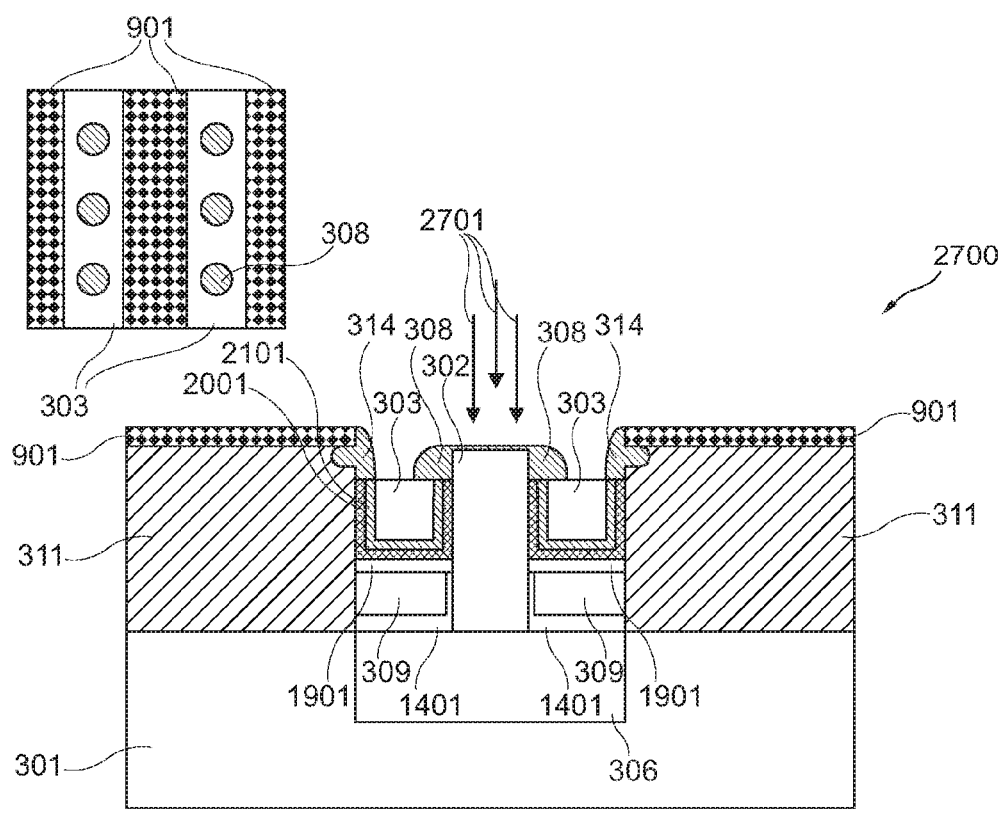
Figure 28:
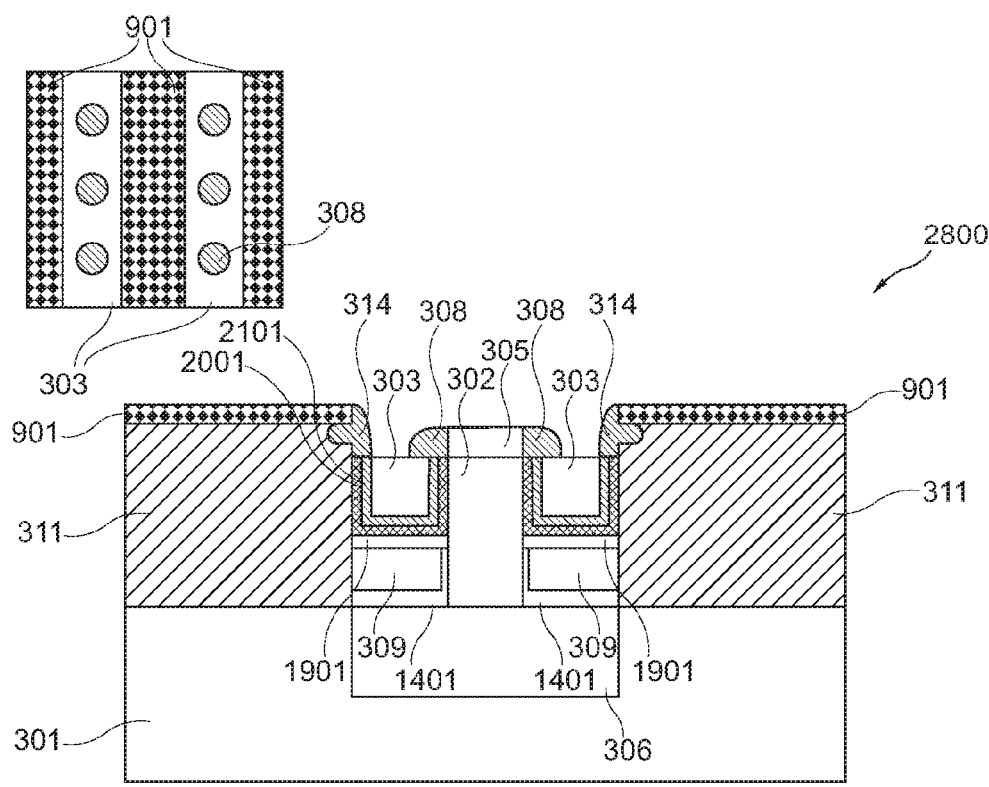

In order to obtain the layer sequence 2700 shown in FIG. 27, a shallow $n^+$-implantation procedure is performed in order to form the drain region (denoted with reference numeral 305, see FIG. 3 or FIG. 28). This is indicated by arrows 2701 in FIG. 27.

Consequently, an $n^+$-drain 305 is formed, as indicated in the layer sequence 2800 as shown in FIG. 28.

Figure 29:
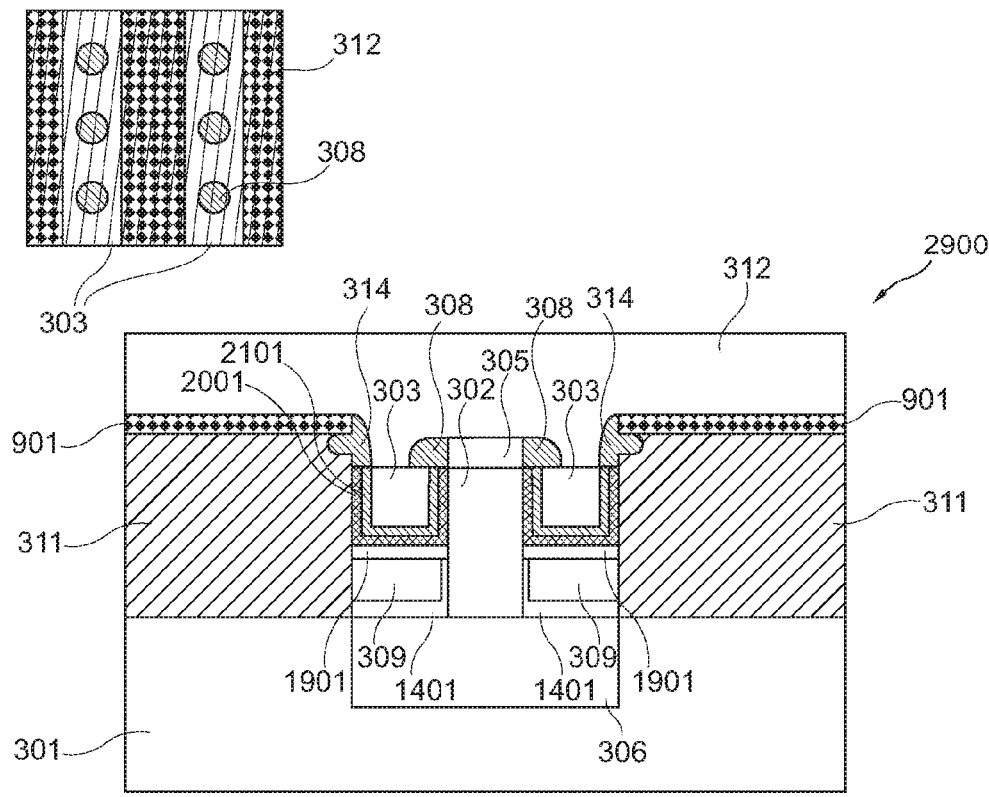

In order to obtain the layer sequence 2900 shown in FIG. 29, a silicon oxide layer 312 is deposited on the entire surface of the layer sequence 2800.

Figure 30:
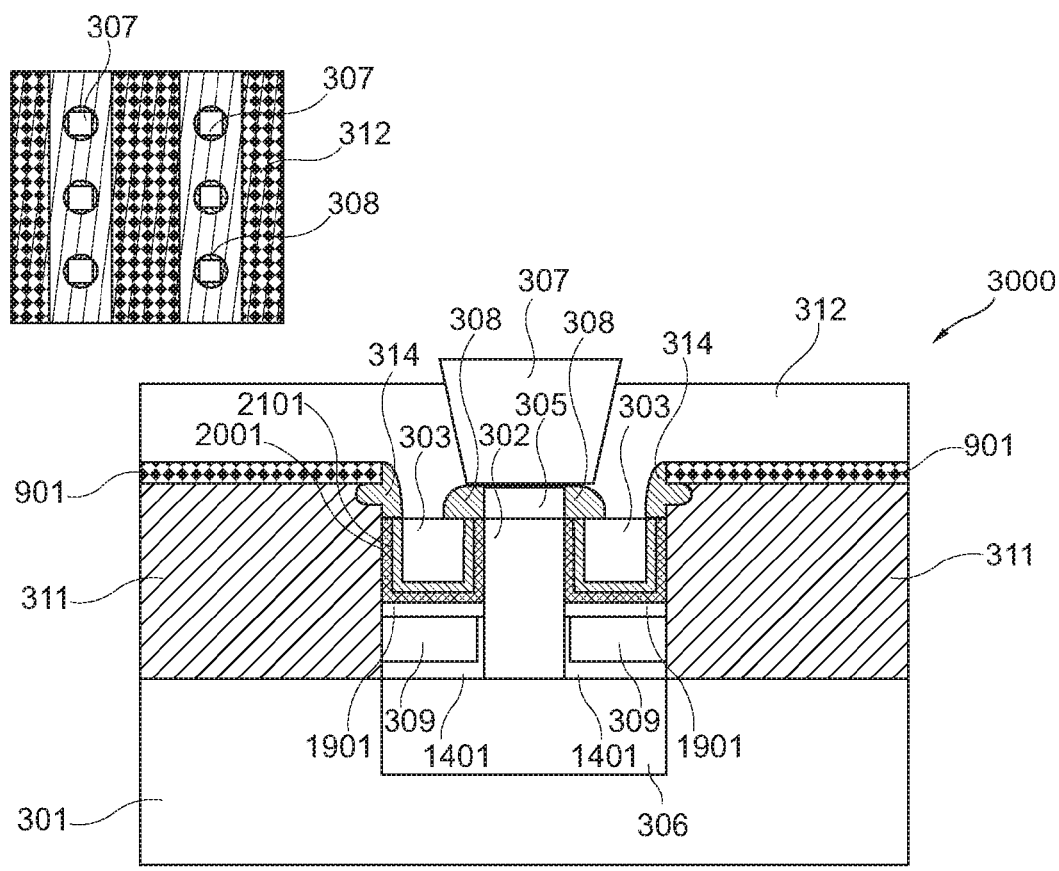

In order to obtain the layer sequence 3000 shown in FIG. 30, the electrically insulating layer 312 is patterned using a lithography procedure and an etching procedure, thereby forming a through hole in the layer 312 to thereby expose a surface of the drain region 305. Then, electrically conductive material is filled in the hole to form an electrically conductive contact 307.

In other words, manufacture of a contact to the drain 305 stopping at the nitride structure 308 is performed. The contact 307 may be wider than the nanowire 302, and possible misalignments (non-self-aligned contact) may be taken into account and are not harmful thanks to the nitride spacers 308.

The configuration shown in FIG. 30 essentially equals to the configuration shown in FIG. 3.

As an alternative to such an implementation of the memory transistor using a SONOS architecture, it is also possible to manufacture the memory transistor including a floating gate.

For this purpose, the manufacturing procedures described above referring to FIG. 7 to FIG. 17 can be performed and can be combined with the processing procedures that will be explained below referring to FIG. 31 to FIG. 46. As a result, a memory cell similar to that shown in FIG. 5 is obtainable.

Figure 31:
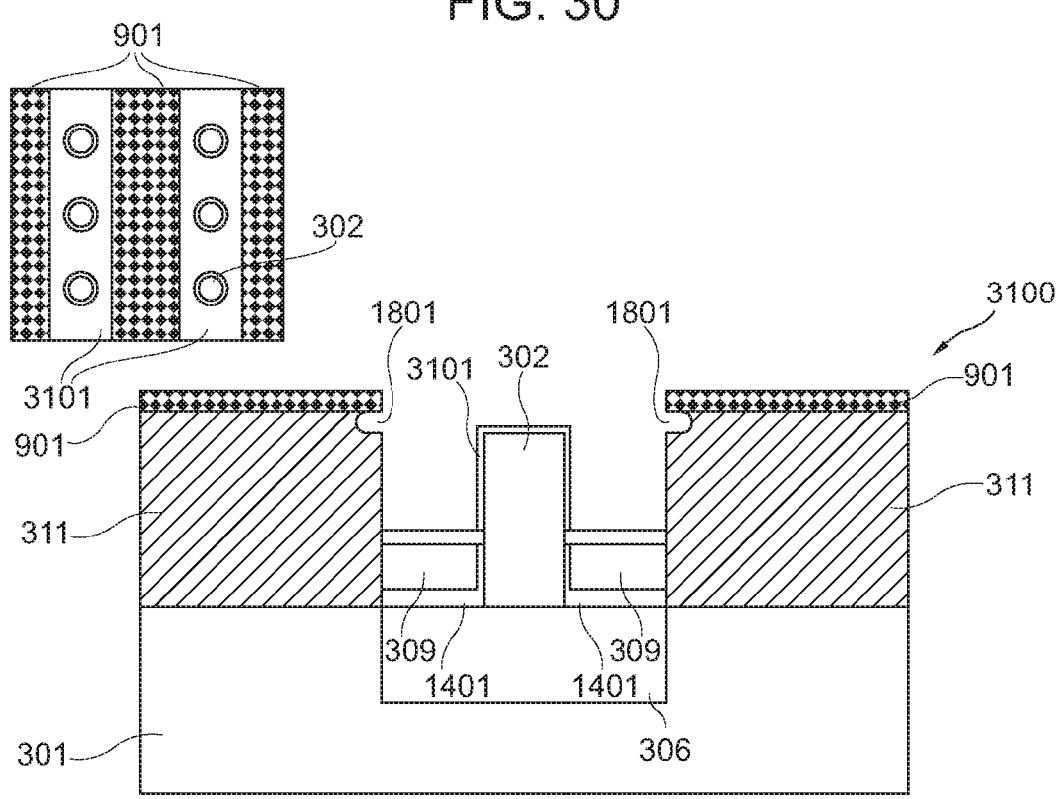

Referring to FIG. 31, after forming the access gate 309 (common to SONOS), a tunnel oxide layer 3101 is grown, providing isolation at the polygate side 309.

Figure 32:
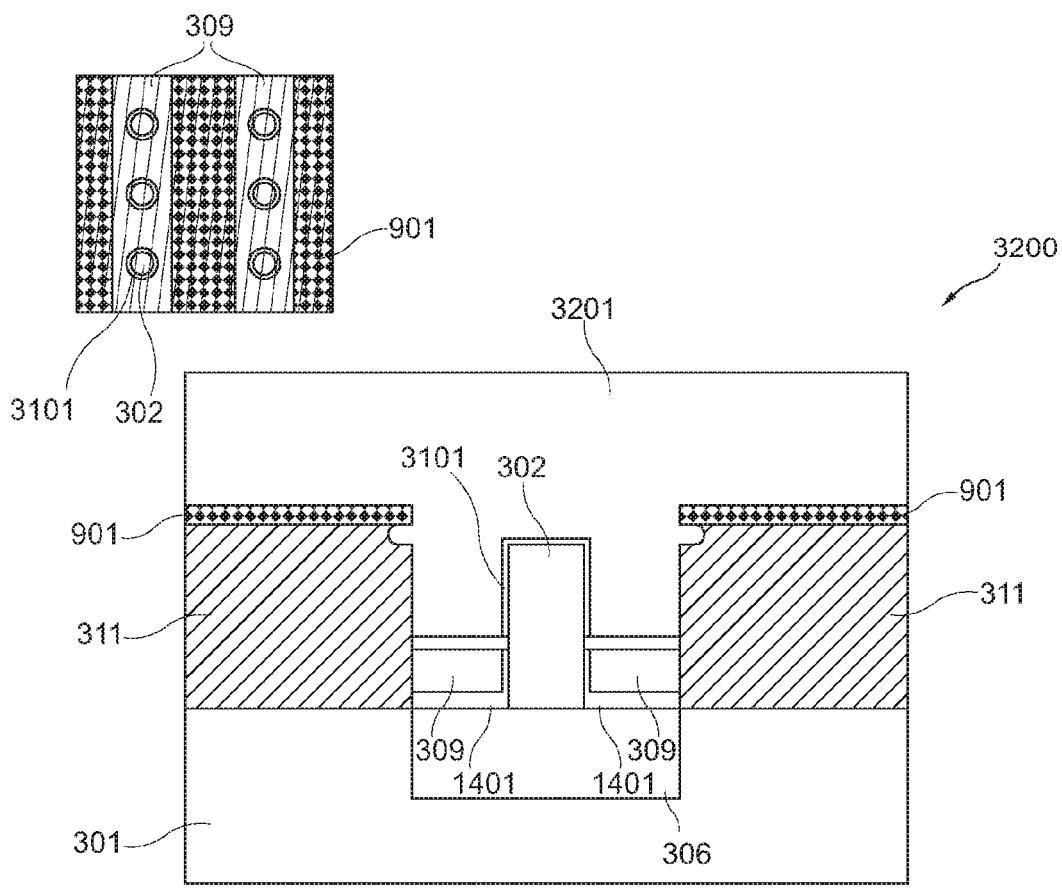

The layer sequence 3200 shown in FIG. 32 is obtained by depositing polysilicon material for the floating gate, thereby forming a polysilicon layer 3201.

Figure 33:
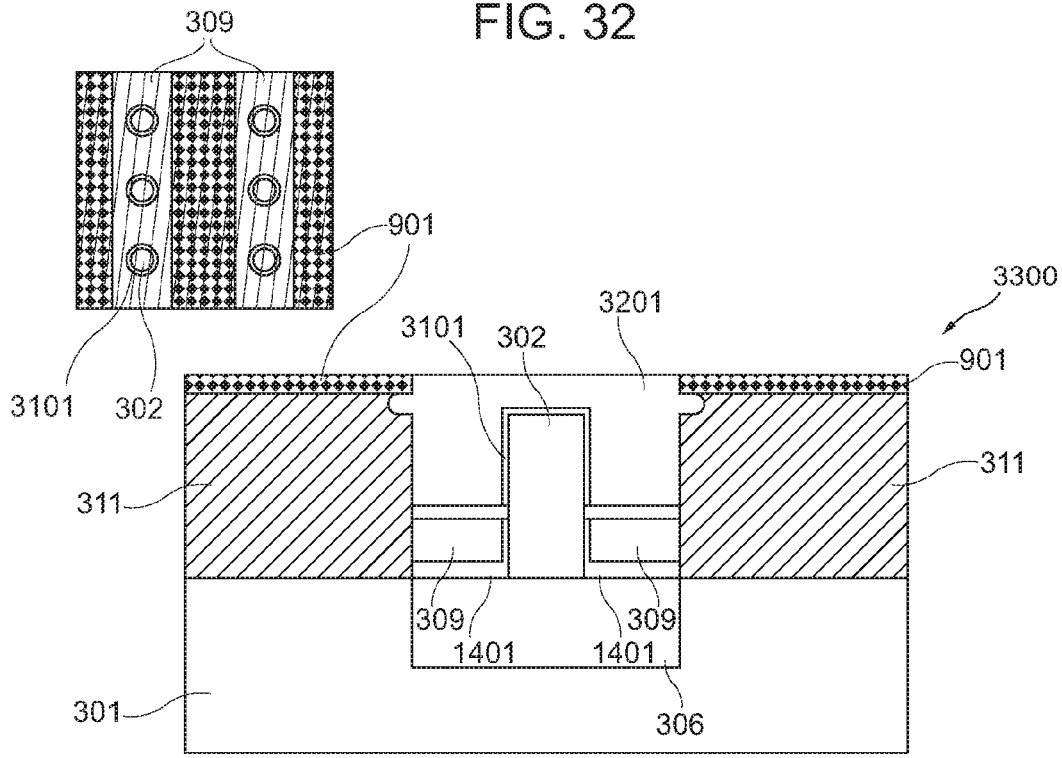

The layer sequence 3300 shown in FIG. 33 is obtained by planarizing the polysilicon structure 3201 by CMP ("chemical mechanical polishing").

Figure 34:
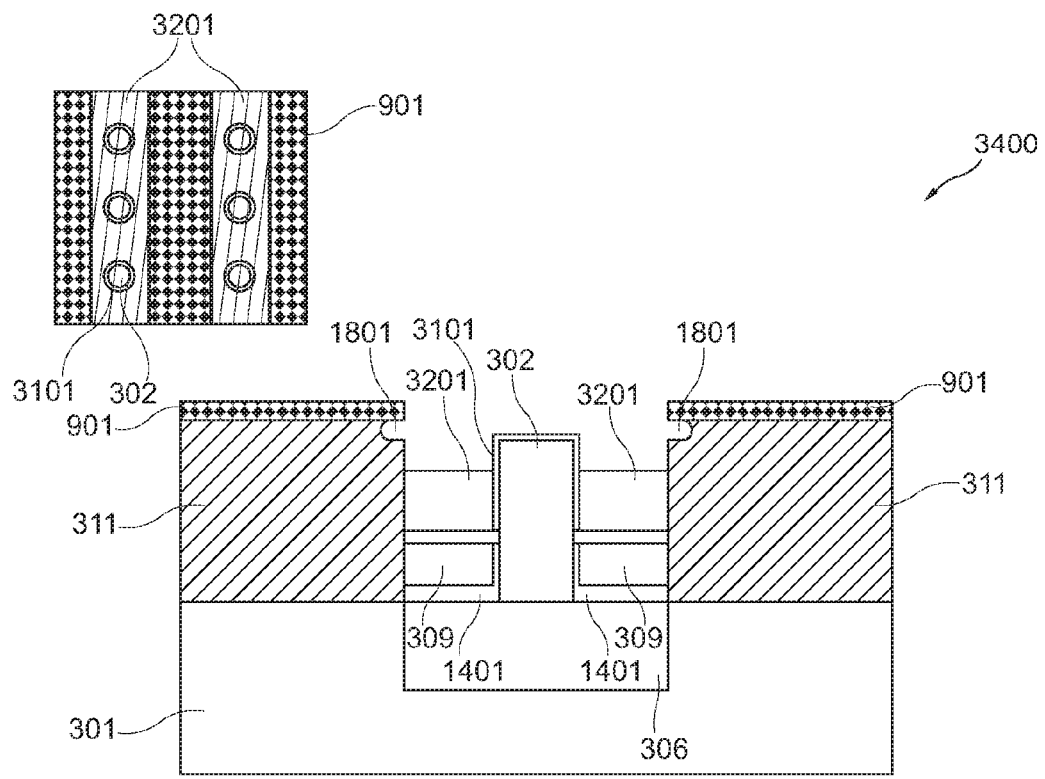

To obtain a layer sequence 3400 as shown in FIG. 34, the polysilicon structure 3201 is further etched and therefore selectively removed relative to silicon oxide to build the floating gate.

Figure 35:
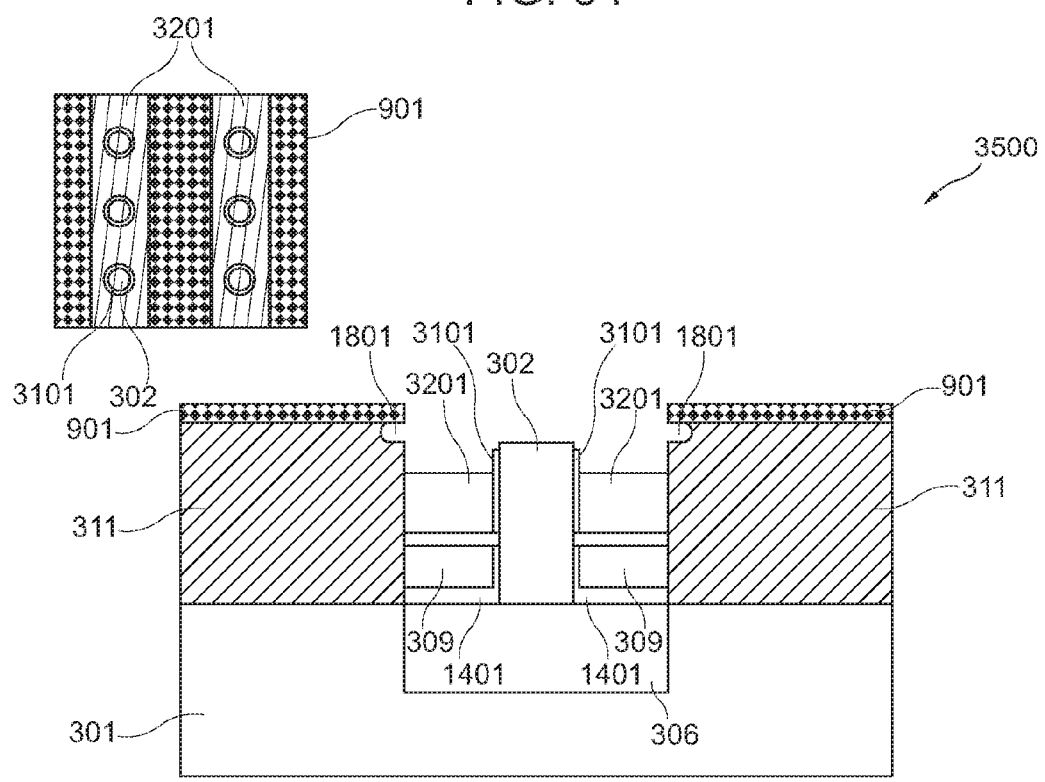

In order to obtain the layer sequence 3500 shown in FIG. 35, a top portion of the electrically insulating structure 3101 is removed by wet etching.

Figure 36:
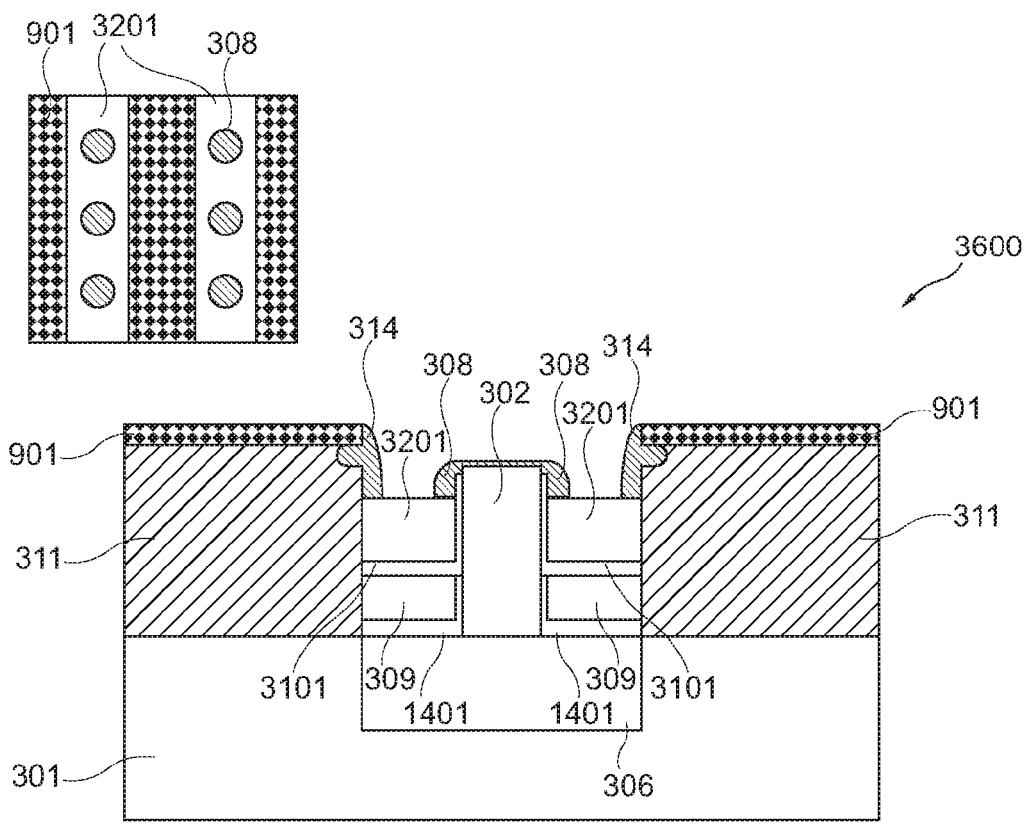

In order to obtain the layer sequence 3600 shown in FIG. 36, lateral silicon nitride spacers 308, 314 are formed to cover lateral walls of the first source/drain region to be able to contact without harming the device.

Figure 37:
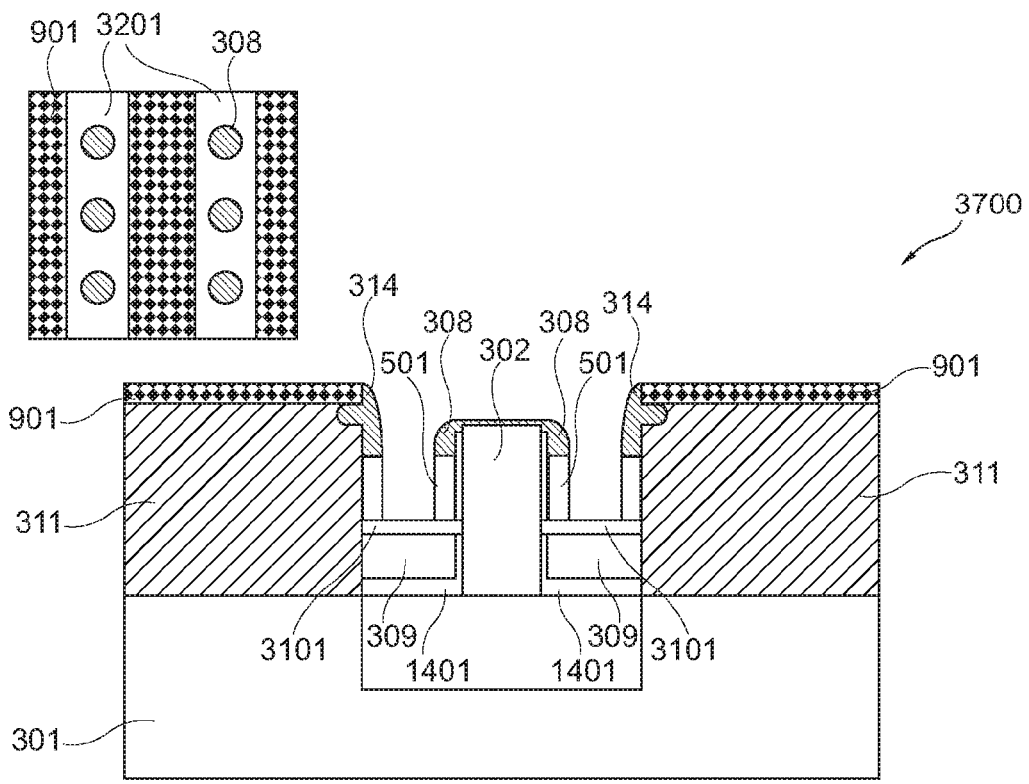

In order to obtain the layer sequence 3700 of FIG. 37, a polysilicon overetch procedure is performed, removing the non-exposed portions of the polysilicon material 3201 which is not covered by the nitride spacers 308, 314.

Figure 38:
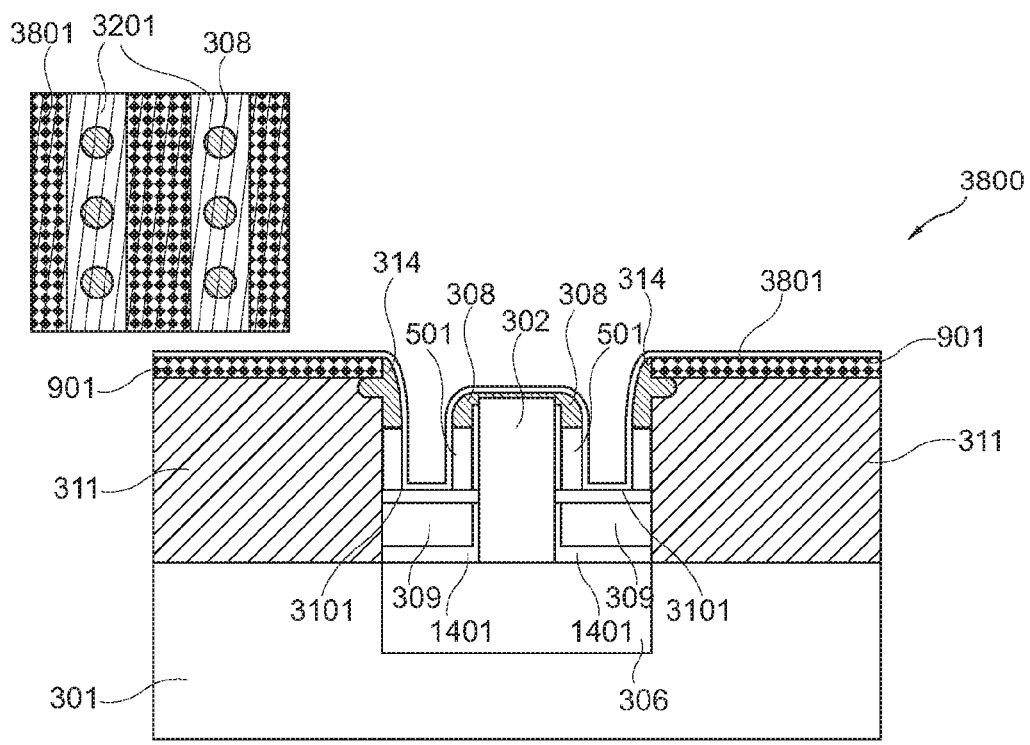

A layer sequence 3800 shown in FIG. 38 is obtained by depositing silicon oxide ($SiO_2$) as interpolydielectric material, thereby forming a layer 3801 covering the layer sequence 3700.

Figure 39:
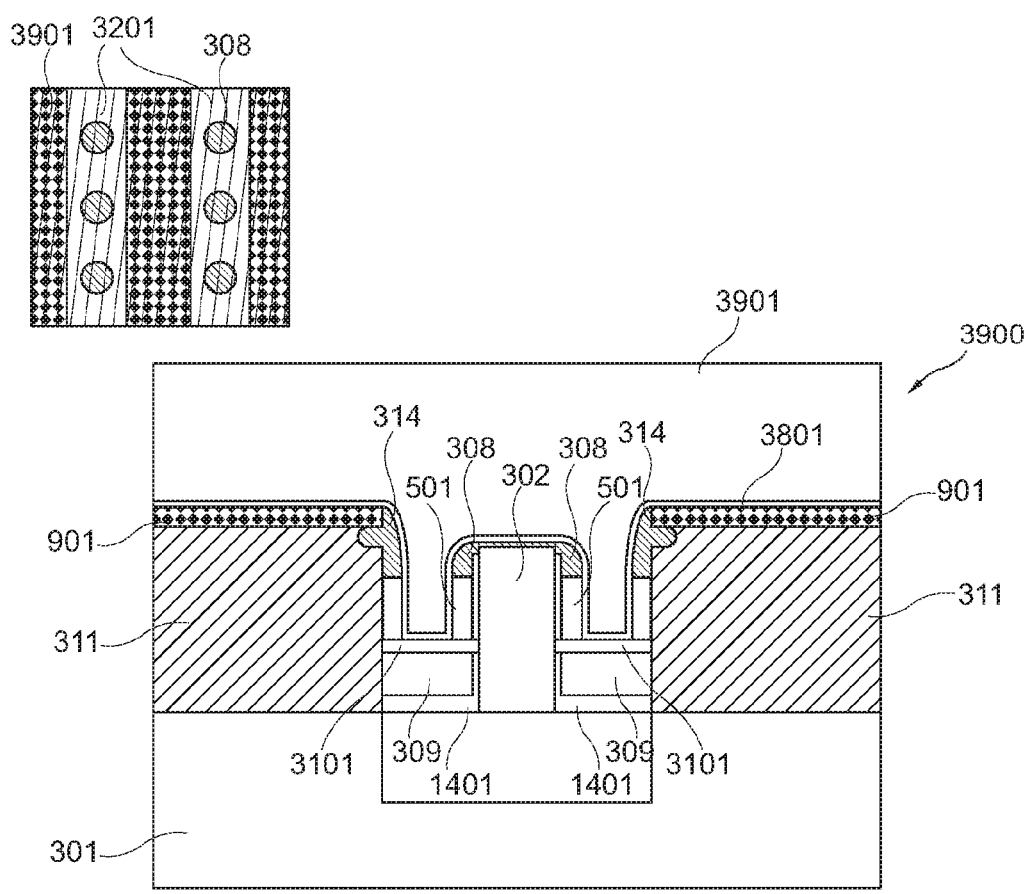

In order to obtain the layer sequence 3900 shown in FIG. 39, polysilicon material 3901 is deposited on the surface of the layer sequence 3800, thereby providing material for forming the control gate.

Figure 40:
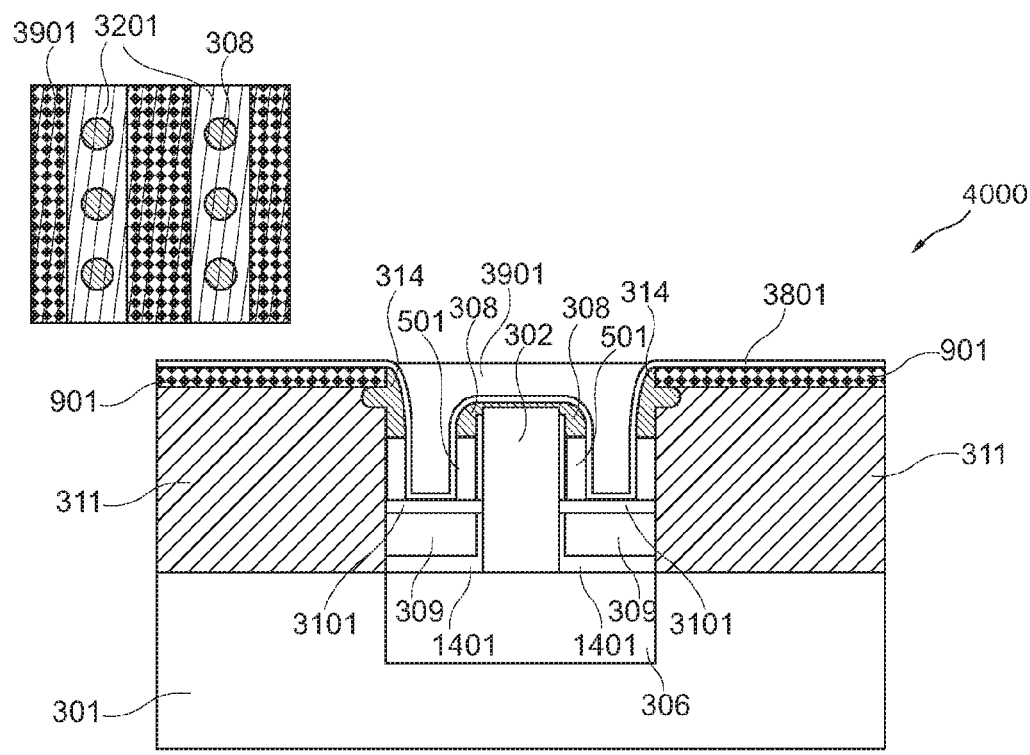

In order to obtain a layer sequence 4000 shown in FIG. 40, the polysilicon structure 3901 is planarized by performing a CMP procedure ("chemical mechanical polishing").

Figure 41:
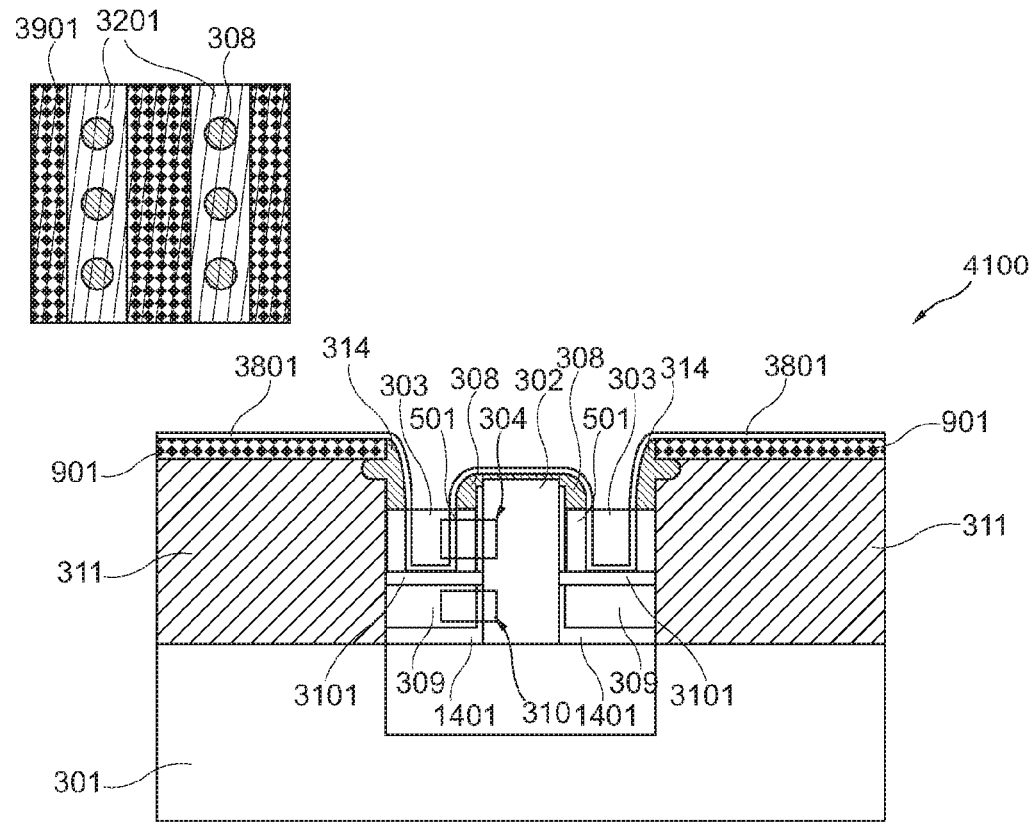

In order to obtain the layer sequence 4100 shown in FIG. 41, a control gate 303 are formed by selectively etching polysilicon material of the structure 3901 relative to silicon oxide.

Figure 42:
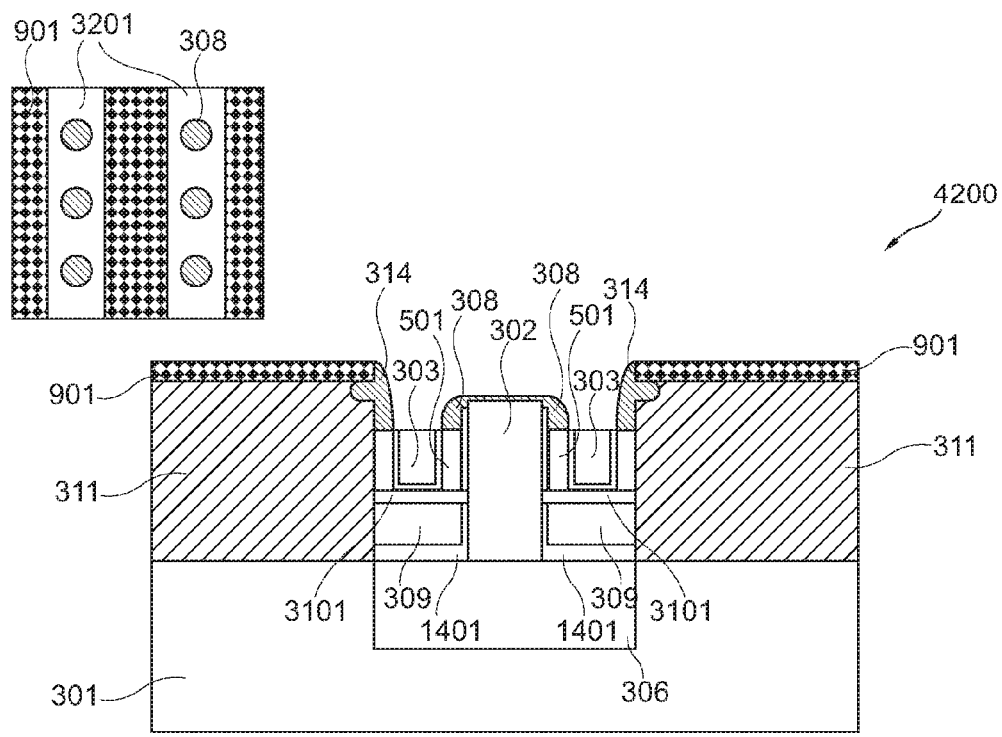

By etching the silicon oxide material on the surface of the layer sequence 4100, the layer sequence 4200 shown in FIG. 42 is obtained.

Figure 43:
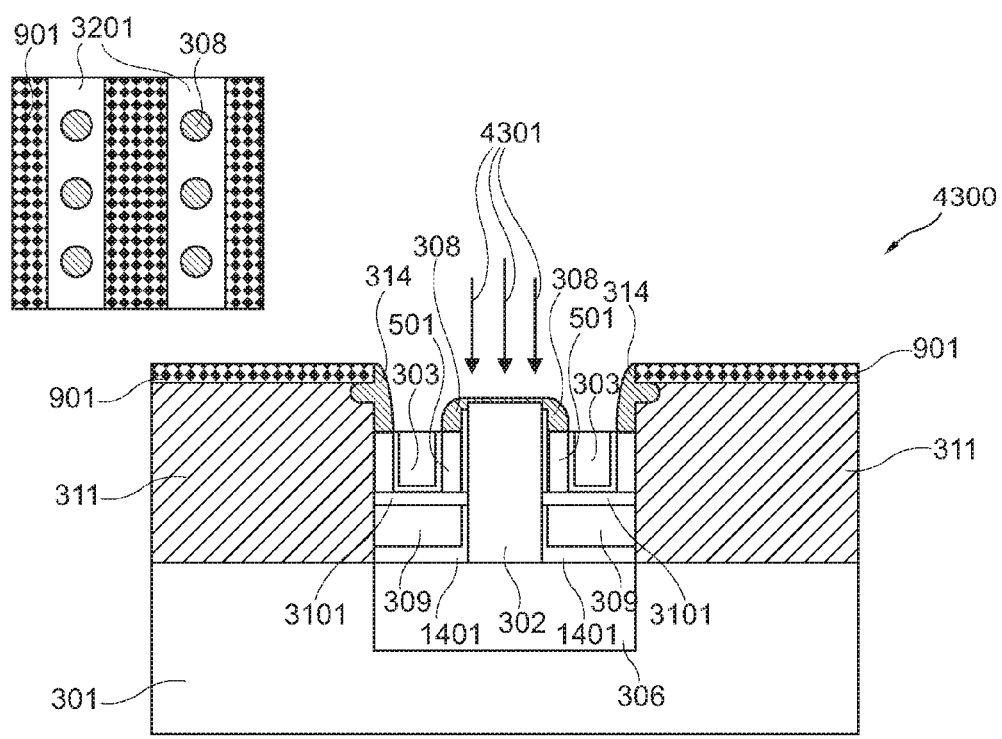

Subsequently, as shown in a layer sequence 4300 in FIG. 43, an $n^+$-shallow implantation procedure is performed to form the drain 305 in an upper portion of the nanowire 302 (see FIG. 44). Arrows 4301 indicate this doping procedure schematically.

Figure 44:
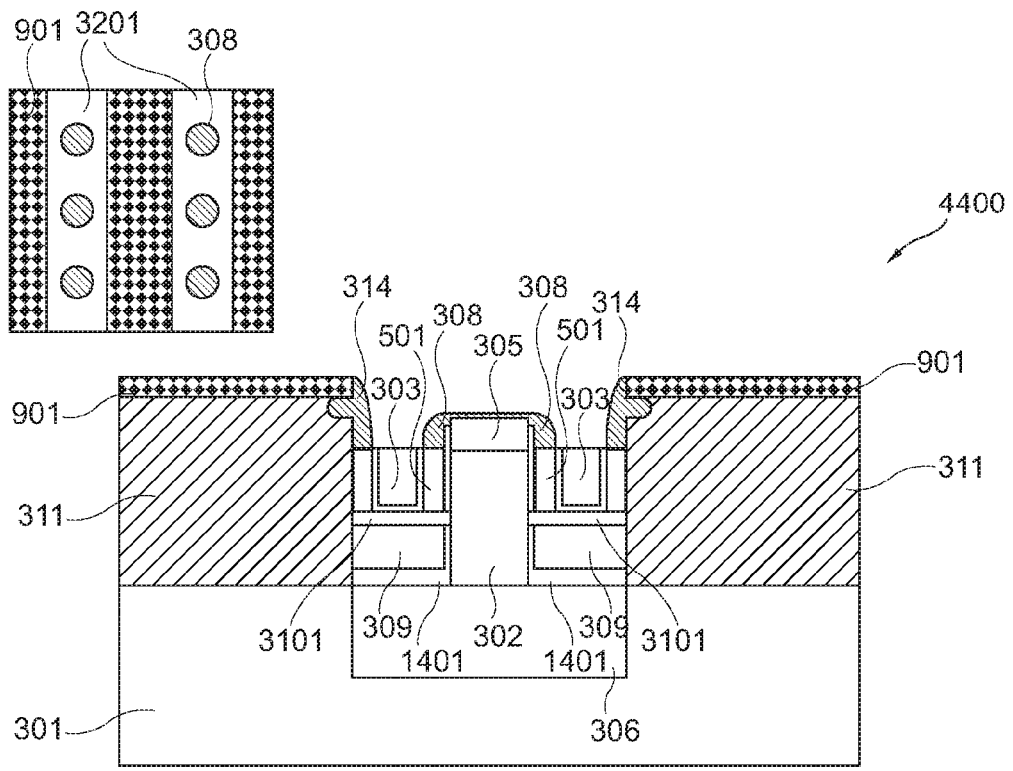

Consequently, the layer sequence 4400 shown in FIG. 44 shows the second source/drain region 305.

Figure 45:
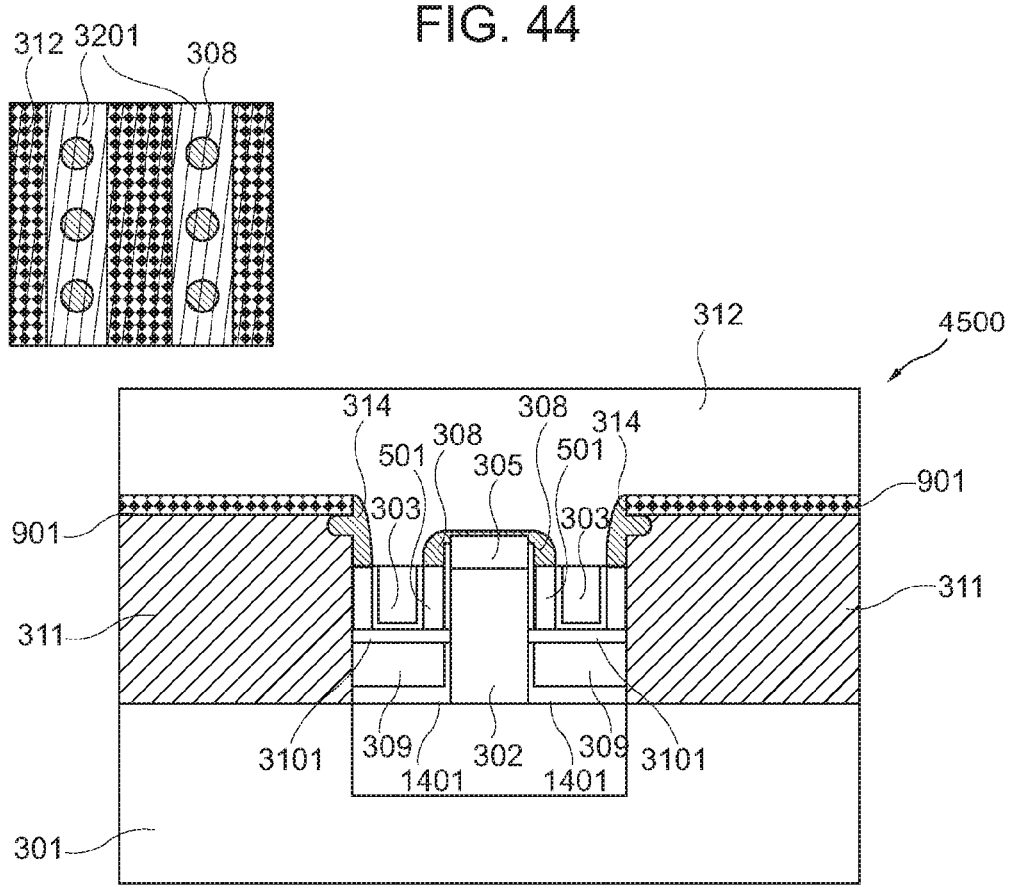

The layer sequence 4500 shown in FIG. 45 is obtained by depositing silicon oxide material on the surface of the layer sequence 4400, thereby forming an electrically insulating layer 312.

Figure 46:
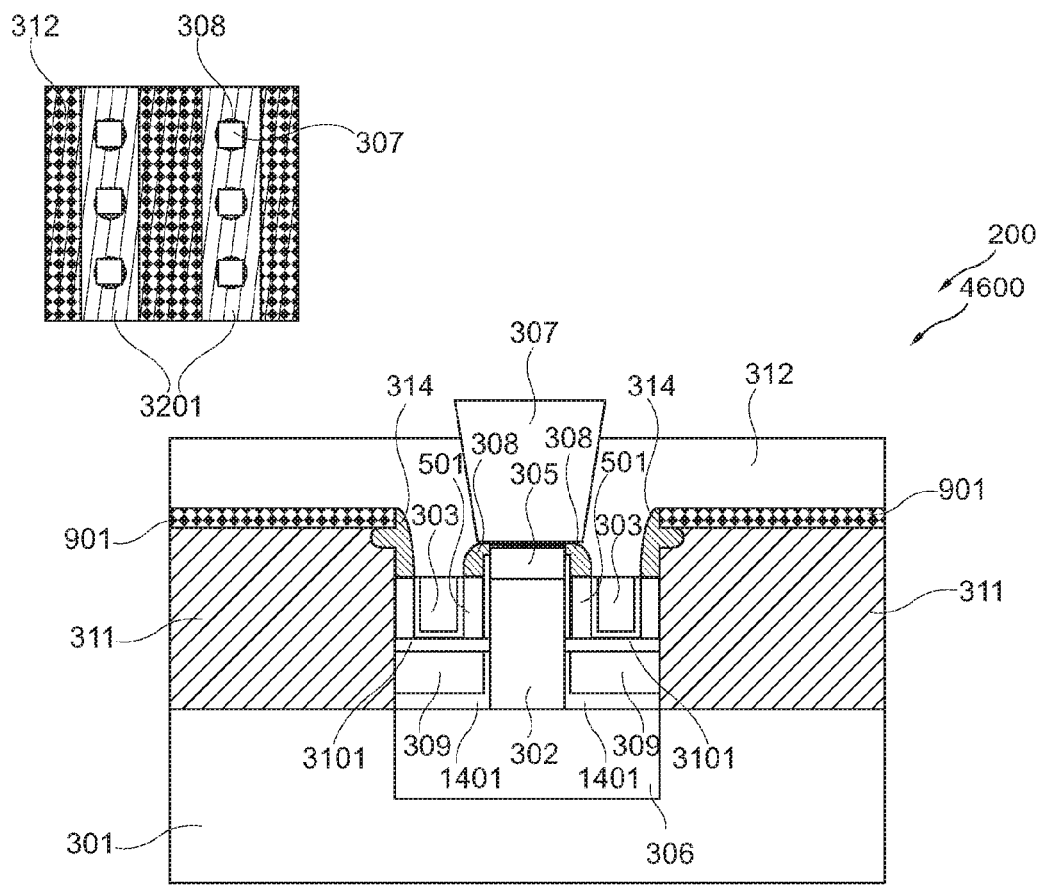

Then, as can be taken from the layer sequence 4600 in FIG. 46, a contact to the drain 305 is provided by item 307. Again, possible misalignments of the contact 307, or the fact that the contact 307 for contacting the drain 305 is larger than the nanowire 302, is not harmful thanks to the nitride spacers 308.

The layer sequence 4600 essentially corresponds to the memory cell 500 shown in FIG. 5.

The above-described FIG. 7 to FIG. 13 explain a procedure of growing a nanowire 302.

Alternatively, the nanowire can also be manufactured by etching a silicon structure, which will be explained in the following.

Therefore, after having manufactured the layer sequence in a manner as shown in FIG. 47 to FIG. 58, the procedures of FIG. 14 to FIG. 46 can be performed in a similar manner.

Figure 47:
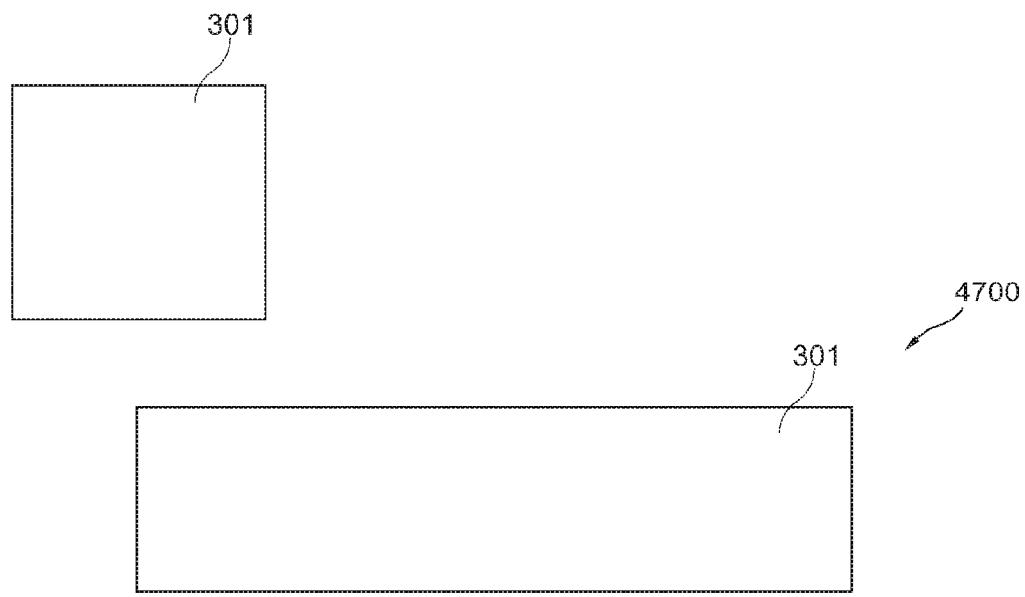
FIG. 47 to FIG. 58 show layer sequences (cross-sectional views and partial plan views) obtained during carrying out another method of forming a nanowire according to an exemplary embodiment of the invention.

FIG. 47 shows a view 4700 of a wafer 301.

Figure 48:
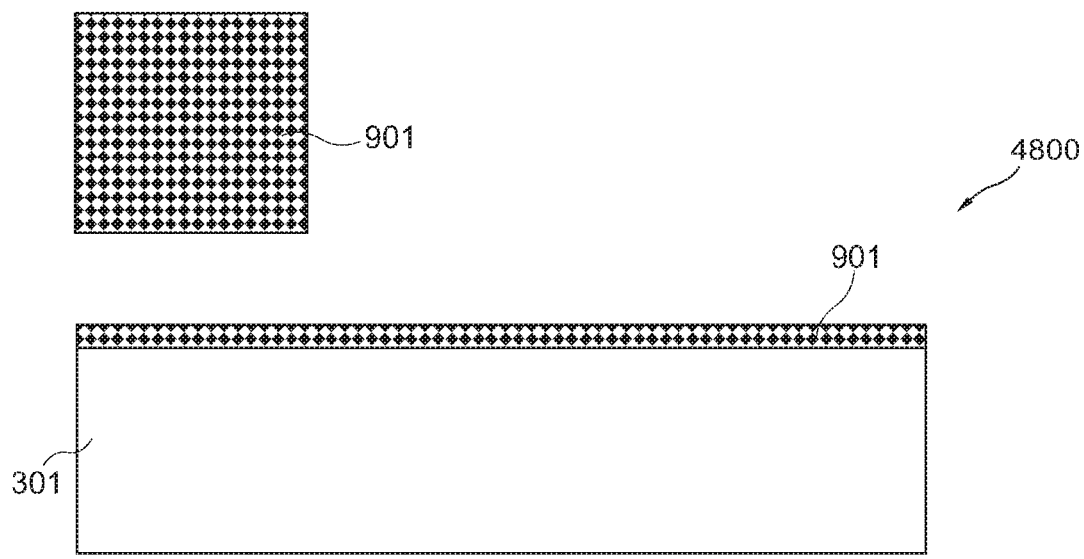

In order to obtain the layer sequence 4800 shown in FIG. 48, a nitride layer 901 is deposited on the wafer 301 to create a stopping layer for a later CMP ("chemical mechanical polishing") procedure.

Figure 49:
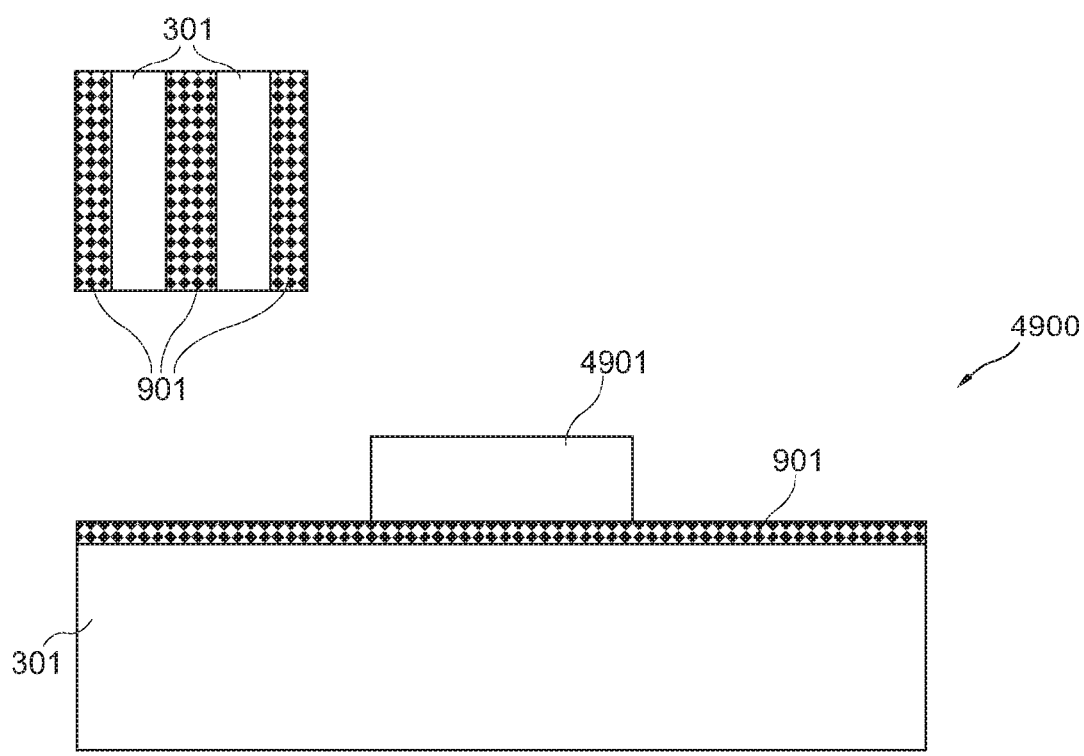

As indicated in FIG. 49 showing a layer sequence 4900, an active mask 4901 is applied as a template for forming trenches (such as STI trenches, "shallow trench isolation").

Figure 50:
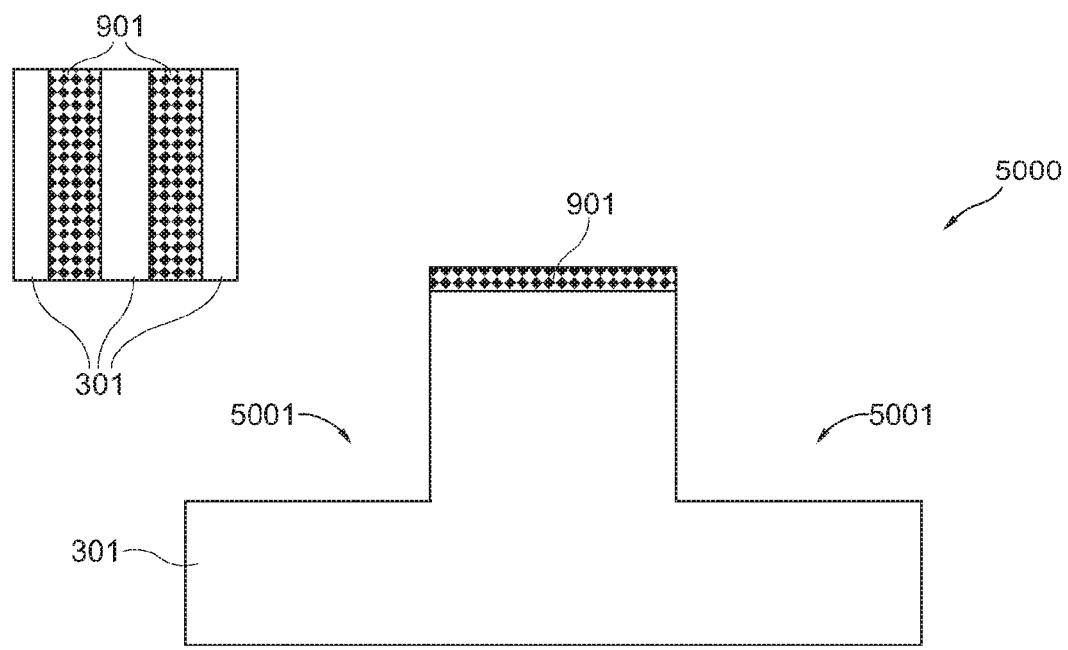

In order to obtain the layer sequence 5000 shown in FIG. 50, the entire wafer 301 is etched, thereby forming STI trenches 5001. The active mask 4901 may be removed.

Figure 51:
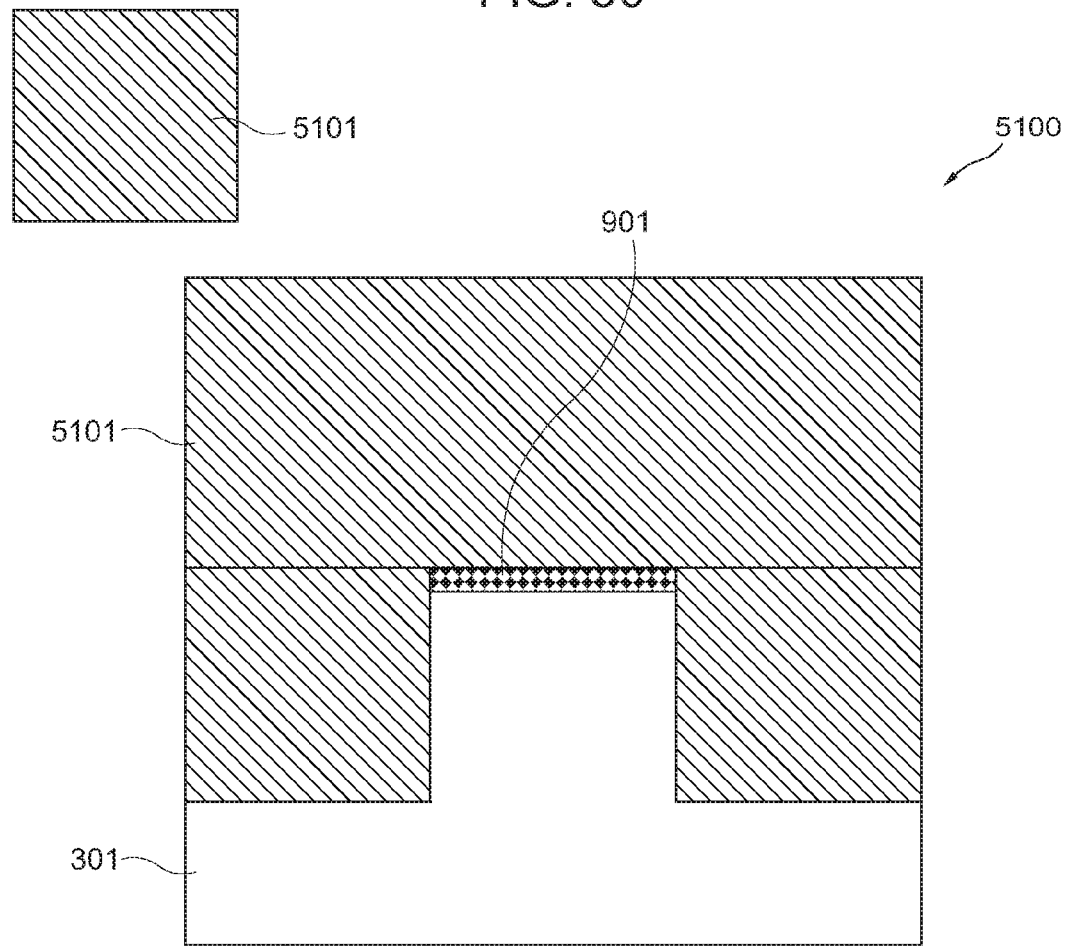

As shown in FIG. 51 illustrating a layer sequence 5100, the trenches 5001 are filled with silicon oxide material, and an additional amount of silicon oxide material is deposited over this layer structure. Consequently, a silicon oxide layer 5101 is formed.

Figure 52:
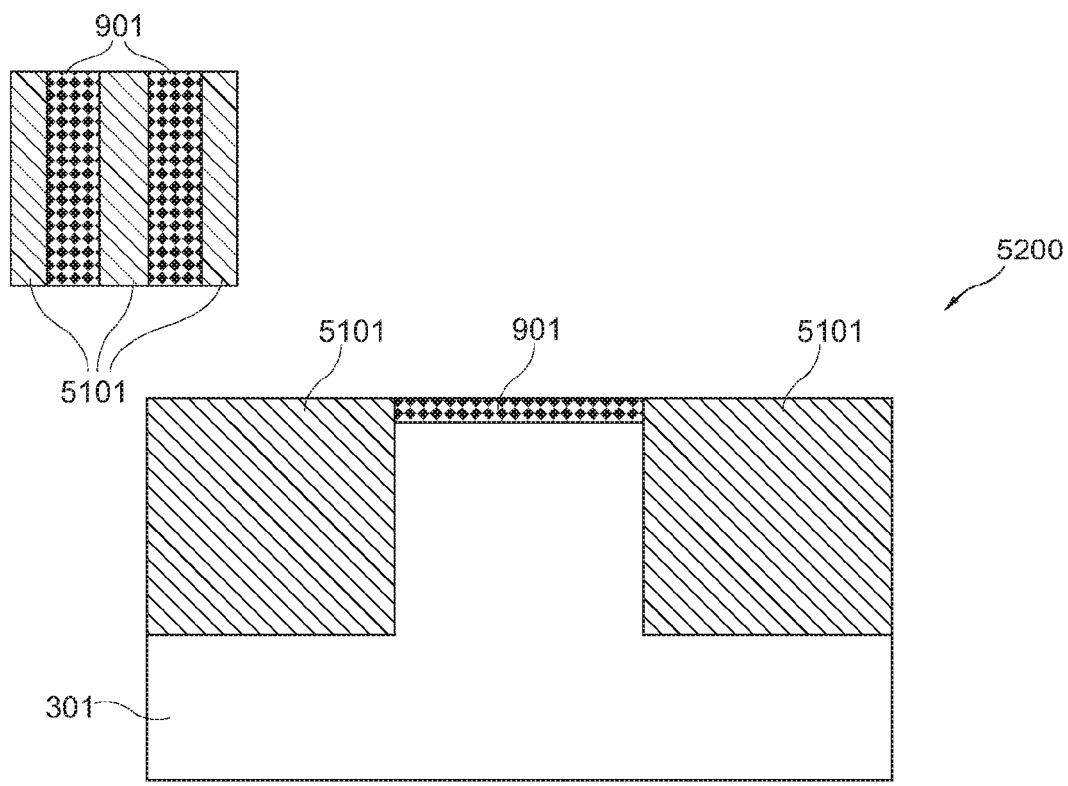

As shown in FIG. 52 illustrating a layer sequence 5200, silicon oxide material of layer 5101 is removed by CMP ("Chemical Mechanical Polishing"), wherein the silicon nitride material 901 is used as a stopping layer.

Figure 53:
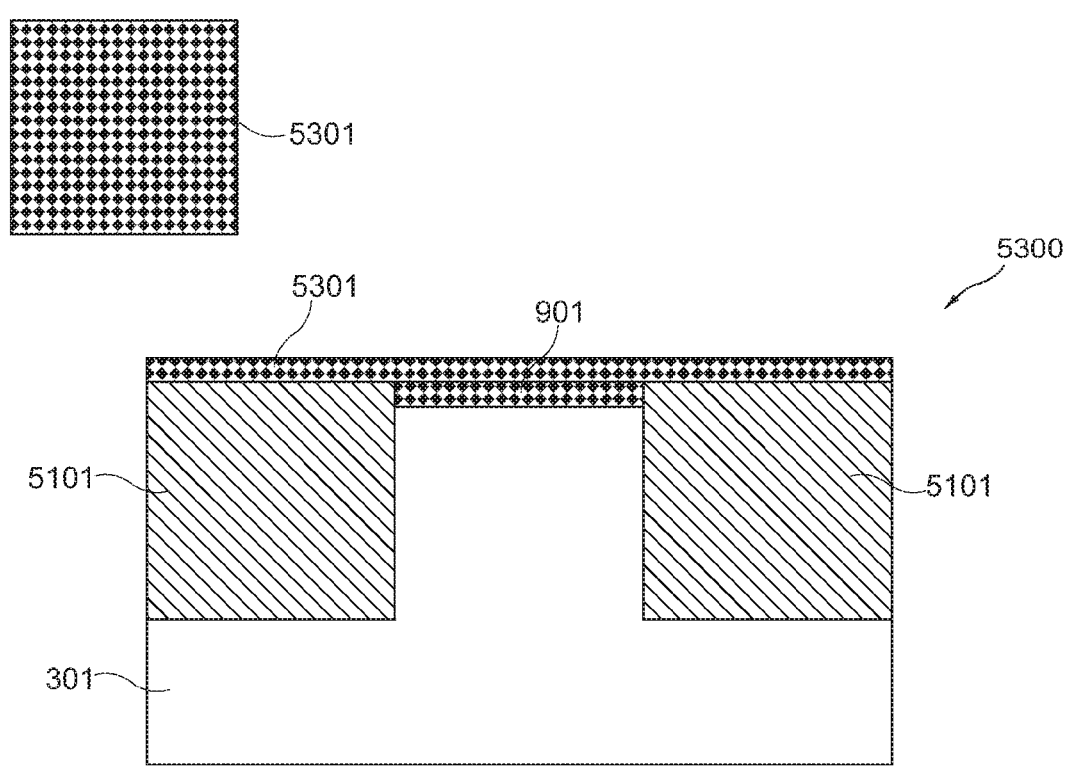

In order to obtain the layer sequence 5300 shown in FIG. 53, silicon nitride material 5301 is deposited on top of the layer sequence 5200.

Figure 54:
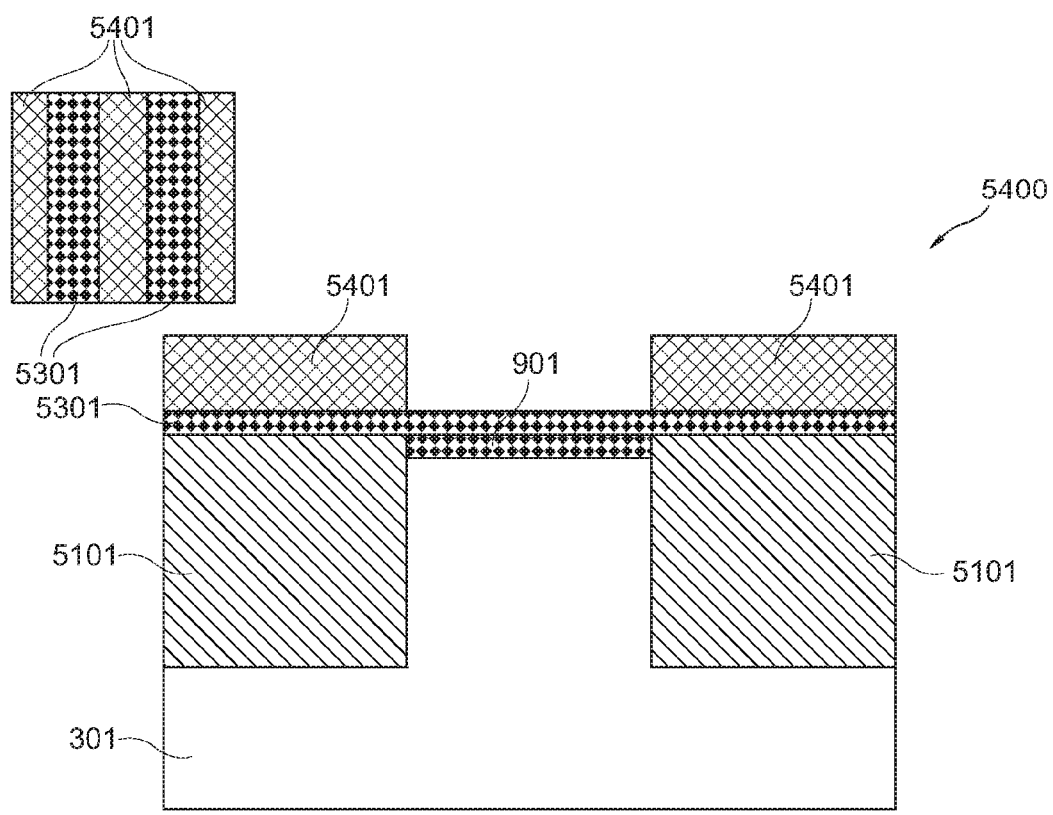

FIG. 54 shows a layer sequence 5400 in which a patterned mask 5401 is shown. The inverse 5401 to the active mask 4901 (instead of light field dark field) is used to remove the silicon nitride material of top of the silicon wafer 301.

Figure 55:
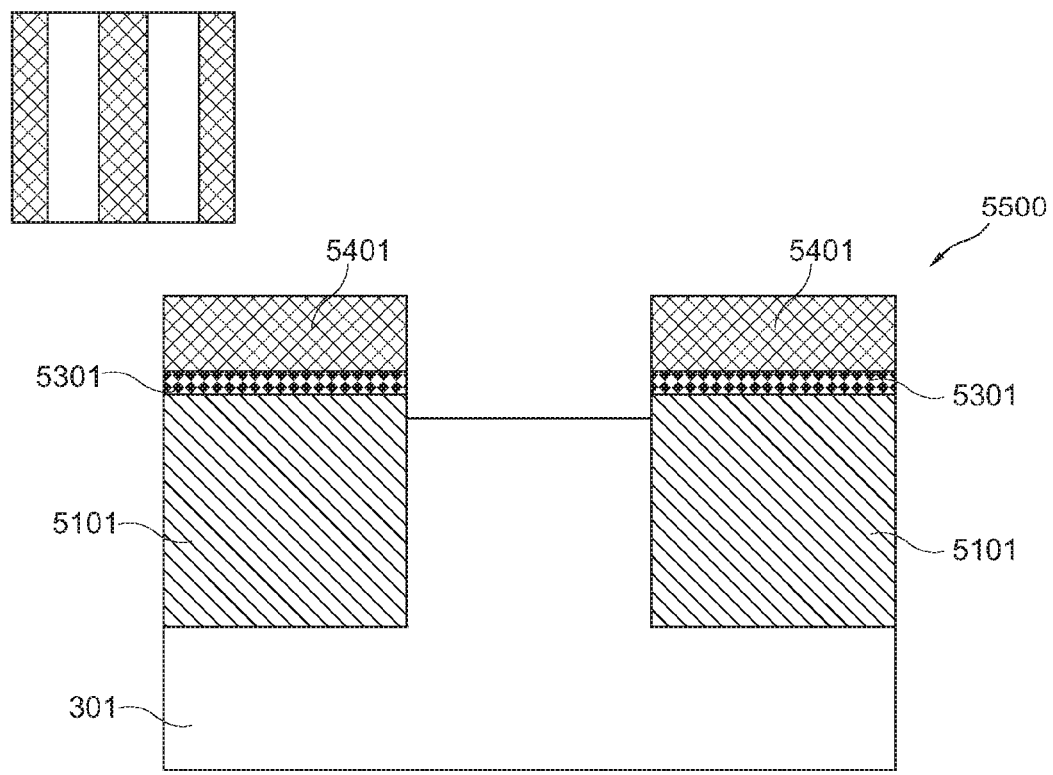

Etching the layers 5301 and 901 results in the layer sequence 5500 shown in FIG. 55.

The nanowire 302 is then defined by etching silicon material of the substrate 301.

Figure 56:
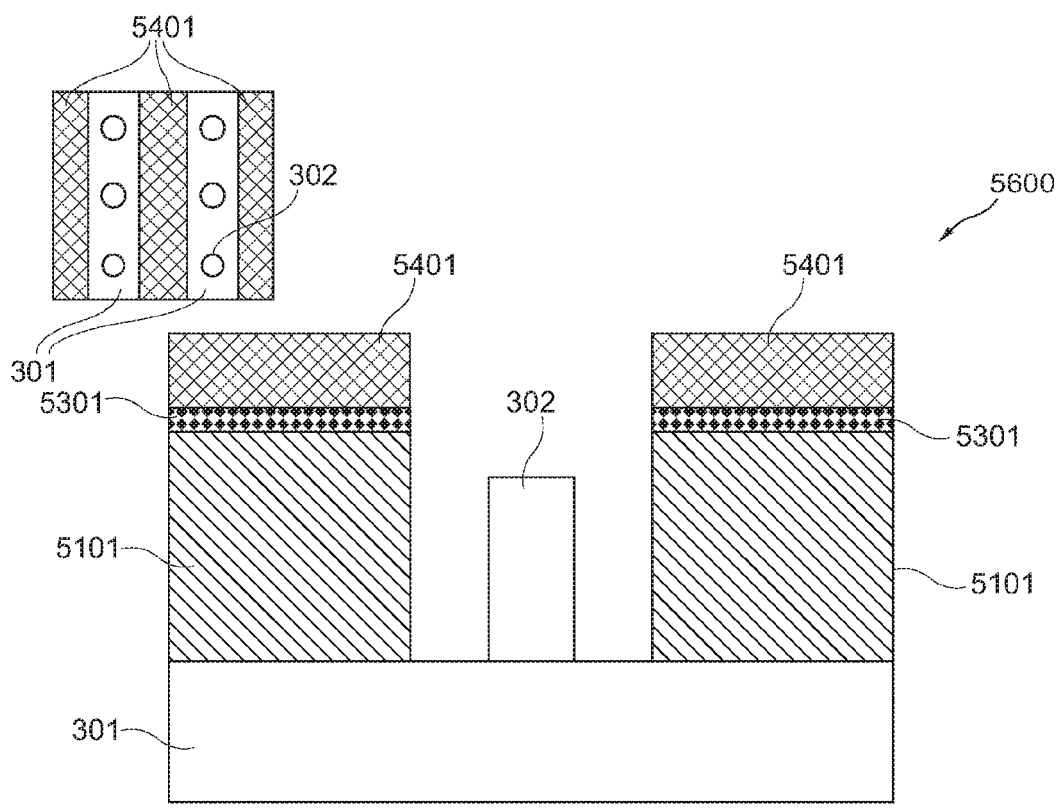

The result of such an etching procedure is shown as the layer sequence 5600 in FIG. 56.

Figure 57:
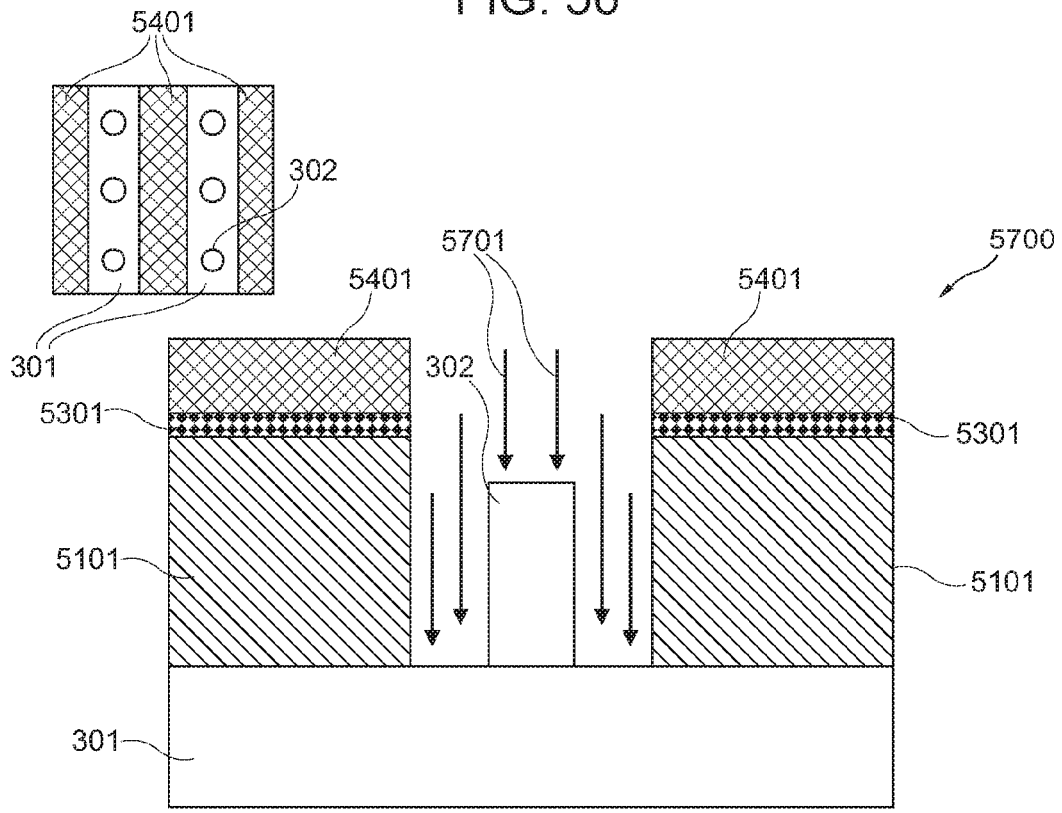

FIG. 57 shows a layer sequence 5700 and arrows 5701 indicating an n+-implantation to define the source and the drain. With a 0° tilt angle of the implantation, it is possible to avoid the doping of the nanowire 302.

Figure 58:
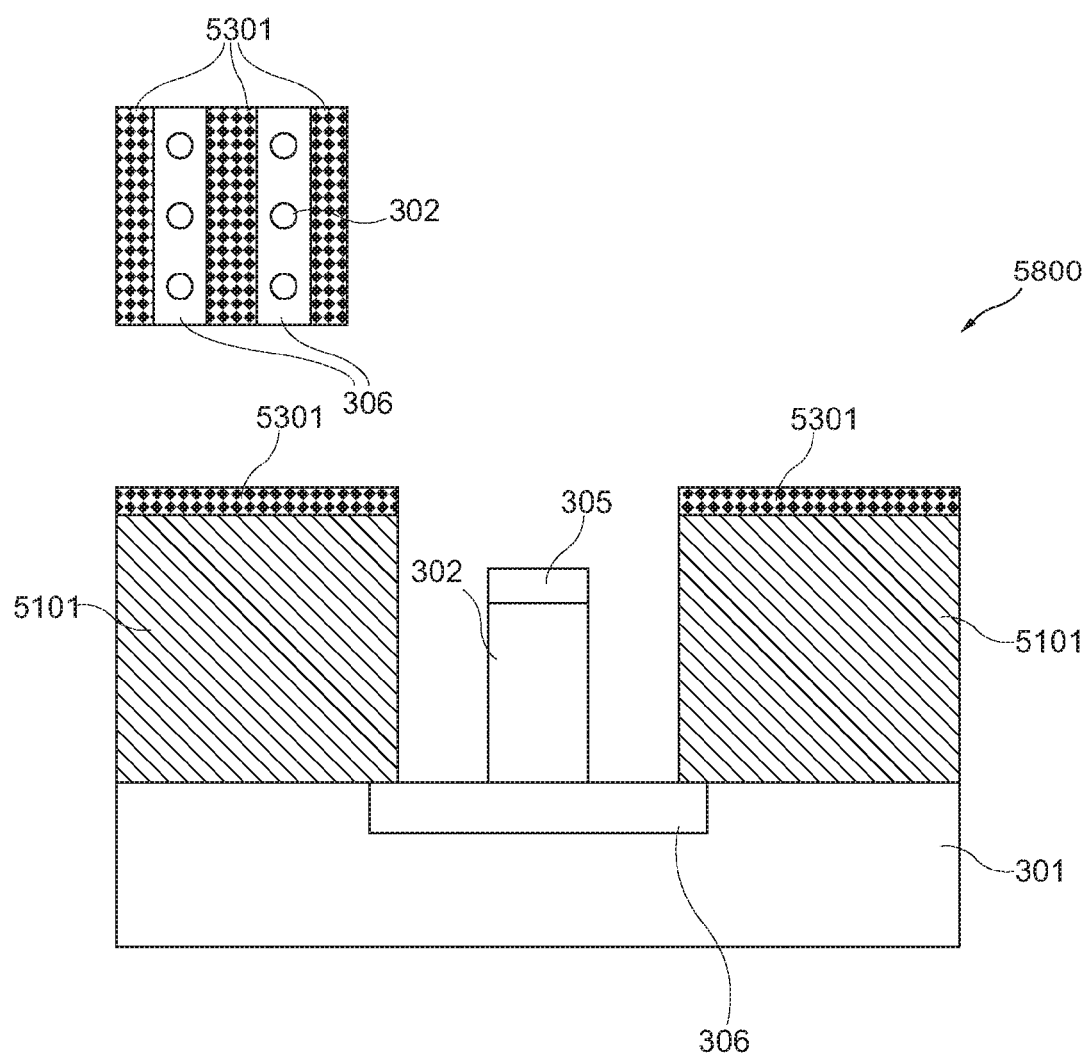

A layer sequence 5800 illustrated in FIG. 58 shows the result with the two source/drain regions 305 and 306.

Starting with the layer sequence 5800, it is possible to continue with FIG. 14.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A memory cell, the memory cell comprising:
   a substrate;
   a nanowire extending along a vertical trench formed in the substrate;
   a control gate surrounding at least a part of the nanowire and configured and arranged to control a conductance state of a portion of the nanowire for storing data in the memory cell;
   a charge storage structure arranged between the control gate and the nanowire and configured and arranged to store the data as an electrical charge; and
   an access gate configured and arranged to control a conductance state of another portion of the nanowire to electrically couple the nanowire to an access circuit for accessing, by reading or writing, the data via the charge storage structure.

2. The memory cell according to claim 1, comprising a first source/drain region coupled to a substrate external end portion of the nanowire and comprising a second source/drain region coupled to a substrate internal end portion of the nanowire.

3. The memory cell according to claim 2, comprising a contact structure coupled to the first source/drain region.

4. The memory cell according to claim 2, comprising an electrically insulating spacer structure surrounding the first source/drain region for electrically decoupling the first source/drain region from the control gate.

5. The memory cell according to claim 3, wherein the contact structure has a larger dimension than the first source/drain region in a direction being perpendicular to the vertical extension of the trench.

6. The memory cell according to claim 1, wherein the charge storage structure comprises one of the group consisting of a floating gate, a silicon oxide-silicon nitride-silicon oxide layer sequence, a silicon nitride structure, and a nanocrystal dot structure.

7. The memory cell according to claim 1, wherein the control gate surrounds the nanowire along the entire circumference of the nanowire.

8. The memory cell according to claim 1, wherein the nanowire has a diameter of less than 100 nm, particularly of less than 50 nm, more particularly of less than 20 nm, in a direction perpendicular to the vertical extension of the trench.

9. The memory cell according to claim 1, wherein the access gate surrounds the nanowire along the entire circumference of the nanowire.

10. The memory cell according to claim 9, wherein the access gate is arranged deeper within the trench than the control gate.

11. The memory cell according to claim 1, wherein the nanowire includes one of the group consisting of a semiconductor nanowire, a carbon nanotube, a silicon nanowire, and a group III-group V nanowire.

12. The memory cell according to claim 1, adapted as a flash memory cell.

13. The memory cell according to claim 1, adapted as a multi-bit memory cell.

14. A memory array, the memory array comprising a plurality of memory cells according to claim 1 formed in the substrate.

15. The memory array according to claim 14, comprising electrically insulating regions between adjacent trenches.

16. The memory array according to claim 14, wherein a common control gate is provided in common for a sub-group of at least two of the plurality of memory cells.

17. A method of manufacturing a memory cell, the method comprising
   forming a vertical trench in a substrate;
   forming a nanowire extending along the vertical trench;
   forming a control gate surrounding at least a part of the nanowire and configured and arranged to control a conductance state of a portion of the nanowire for storing data in the memory cell;
   arranging a charge storage structure between the control gate and the nanowire, the charge storage structure configured and arranged to store the data as an electrical charge; and
   forming an access gate configured and arranged to control a conductance state of another portion of the nanowire to electrically couple the nanowire to an access circuit for accessing the data via the charge storage structure.

18. The method according to claim 17, wherein the nanowire is formed by one of the group consisting of a growing procedure and an etching procedure.

* * * * *